US008288197B2

(12) United States Patent
Yukawa et al.

(10) Patent No.: US 8,288,197 B2
(45) Date of Patent: Oct. 16, 2012

(54) METHOD FOR MANUFACTURING A SEMICONDUCTOR DEVICE INCLUDING A MEMORY DEVICE COMPRISING AN INSULATOR MIXTURE REGION IN A CONDUCTIVE LAYER

(75) Inventors: Mikio Yukawa, Kanagawa (JP); Nobuharu Ohsawa, Zama (JP); Yoshinobu Asami, Atsugi (JP); Ikuko Kawamata, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 133 days.

(21) Appl. No.: 11/918,960

(22) PCT Filed: Apr. 25, 2006

(86) PCT No.: PCT/JP2006/309128
§ 371 (c)(1),
(2), (4) Date: Oct. 22, 2007

(87) PCT Pub. No.: WO2006/118294
PCT Pub. Date: Nov. 9, 2006

(65) Prior Publication Data
US 2009/0140231 A1 Jun. 4, 2009

(30) Foreign Application Priority Data
Apr. 27, 2005 (JP) .................... 2005-130632

(51) Int. Cl.
*H01L 21/00* (2006.01)
*H01L 47/00* (2006.01)
*H01L 29/08* (2006.01)
*H01L 35/24* (2006.01)
*H01L 51/00* (2006.01)
*H01L 29/66* (2006.01)

(52) U.S. Cl. ............... 438/99; 257/4; 257/40; 257/140; 257/E51.003; 257/E51.011

(58) Field of Classification Search ..................... None
See application file for complete search history.

(56) References Cited

U.S. PATENT DOCUMENTS
4,972,370 A 11/1990 Morimoto et al.
(Continued)

FOREIGN PATENT DOCUMENTS
CA 2 515 614 8/2004
(Continued)

OTHER PUBLICATIONS
International Search Report (Application No. PCT/JP2006/309128) dated Aug. 8, 2006.
(Continued)

*Primary Examiner* — Nathan Ha
*Assistant Examiner* — Michael Jung
(74) *Attorney, Agent, or Firm* — Eric J. Robinson; Robinson Intellectual Property Law Office, P.C.

(57) ABSTRACT

It is an object of the present invention to provide a technique in which a high-performance and highly reliable semiconductor device can be manufactured at low cost with high yield. A memory device according to the present invention has a first conductive layer including a plurality of insulators, an organic compound layer over the first conductive layer including the insulators, and a second conductive layer over the organic compound layer.

17 Claims, 19 Drawing Sheets

U.S. PATENT DOCUMENTS

| | | |
|---|---|---|
| 5,853,905 A | 12/1998 | So et al. |
| 5,883,397 A | 3/1999 | Isoda et al. |
| 6,055,180 A | 4/2000 | Gudesen et al. |
| 6,218,677 B1 | 4/2001 | Broekaert |
| 6,465,828 B2 | 10/2002 | Agarwal |
| 6,548,825 B1 | 4/2003 | Yoshii et al. |
| 6,768,157 B2 | 7/2004 | Krieger et al. |
| 6,806,526 B2 | 10/2004 | Krieger et al. |
| 6,815,286 B2 | 11/2004 | Krieger et al. |
| 6,870,183 B2 | 3/2005 | Tripsas et al. |
| 6,947,321 B2 | 9/2005 | Tanabe |
| 6,950,331 B2 | 9/2005 | Yang et al. |
| 6,979,837 B2 | 12/2005 | Tripsas et al. |
| 6,992,323 B2 | 1/2006 | Krieger et al. |
| 7,075,105 B2 | 7/2006 | Kano |
| 7,170,779 B2 | 1/2007 | Miyawaki et al. |
| 7,220,985 B2 | 5/2007 | Cheung et al. |
| 7,274,035 B2 | 9/2007 | Yang et al. |
| 7,282,380 B2 | 10/2007 | Maruyama et al. |
| 7,344,913 B1 * | 3/2008 | Kingsborough et al. ....... 438/99 |
| 7,465,956 B1 | 12/2008 | Tripsas et al. |
| 7,482,621 B2 | 1/2009 | Yang et al. |
| 7,557,372 B2 | 7/2009 | Yang et al. |
| 7,791,066 B2 | 9/2010 | Yamazaki |
| 7,919,772 B2 | 4/2011 | Furukawa et al. |
| 2002/0056864 A1 | 5/2002 | Agarwal |
| 2003/0053350 A1 | 3/2003 | Krieger et al. |
| 2003/0155602 A1 | 8/2003 | Krieger et al. |
| 2003/0230746 A1 | 12/2003 | Stasiak |
| 2004/0027849 A1 | 2/2004 | Yang et al. |
| 2004/0057323 A1 | 3/2004 | Tanabe |
| 2004/0084670 A1 | 5/2004 | Tripsas et al. |
| 2004/0108501 A1 | 6/2004 | Cheung et al. |
| 2004/0113548 A1 * | 6/2004 | Yamazaki et al. ............ 313/506 |
| 2004/0159835 A1 * | 8/2004 | Krieger et al. .................. 257/40 |
| 2004/0164302 A1 | 8/2004 | Arai et al. |
| 2004/0214381 A1 * | 10/2004 | Ohta .............................. 438/197 |
| 2004/0217347 A1 | 11/2004 | Tripsas et al. |
| 2004/0240261 A1 * | 12/2004 | Kano ........................... 365/158 |
| 2004/0246768 A1 | 12/2004 | Krieger et al. |
| 2004/0246770 A1 | 12/2004 | Kano |
| 2005/0012097 A1 * | 1/2005 | Yamazaki ....................... 257/59 |
| 2005/0093432 A1 * | 5/2005 | Yamazaki et al. ............. 313/503 |
| 2005/0167767 A1 | 8/2005 | Akasaka |
| 2005/0214984 A1 | 9/2005 | Maruyama et al. |
| 2005/0274943 A1 | 12/2005 | Chen |
| 2006/0038169 A1 * | 2/2006 | Mandell et al. .................. 257/40 |
| 2006/0091397 A1 * | 5/2006 | Akimoto et al. ................. 257/72 |
| 2006/0214008 A1 | 9/2006 | Asami et al. |
| 2007/0051940 A1 | 3/2007 | Clemens et al. |
| 2007/0153565 A1 | 7/2007 | Nomura et al. |
| 2008/0017849 A1 | 1/2008 | Yukawa et al. |
| 2008/0042128 A1 | 2/2008 | Furukawa et al. |
| 2008/0210932 A1 | 9/2008 | Yugawa et al. |
| 2009/0065769 A1 | 3/2009 | Yugawa et al. |
| 2009/0081824 A1 | 3/2009 | Tripsas et al. |

FOREIGN PATENT DOCUMENTS

| | | |
|---|---|---|
| EP | 1 381 054 | 1/2004 |
| EP | 1 434 232 | 6/2004 |
| EP | 1513159 A | 3/2005 |
| JP | 62-259478 A | 11/1987 |
| JP | 07-022669 | 1/1995 |
| JP | 11-307261 | 11/1999 |
| JP | 11-307261 A | 11/1999 |
| JP | 2000-030870 | 1/2000 |
| JP | 2001-101368 A | 4/2001 |
| JP | 2002-026277 | 1/2002 |
| JP | 2004-095850 | 3/2004 |
| JP | 2004-513513 | 4/2004 |
| JP | 2004-200569 | 7/2004 |
| JP | 2005-101594 A | 4/2005 |
| JP | 2005-311336 A | 11/2005 |
| JP | 2006-269950 | 10/2006 |
| WO | WO-98/58383 | 12/1998 |
| WO | WO 02/37500 | 5/2002 |
| WO | WO 03/107426 | 12/2003 |
| WO | WO 2004/070789 A2 * | 8/2004 |
| WO | WO-2006/043573 | 4/2006 |
| WO | WO-2006/064859 | 6/2006 |

OTHER PUBLICATIONS

Written Opinion (Application No. PCT/JP2006/309128) dated Aug. 8, 2006.

Ma.L et al., "Organic Nonvolatile Memory by Controlling the Dynamic Copper-Ion Concentration Within Organic Layer,", Appl. Phys. Lett. (Applied Physics Letters, Jun. 14, 2004, vol. 84, No. 24, pp. 4908-4910.

* cited by examiner 58  57  56  55

68  67  66  65

78  79  77  76  75

FIG. 18A
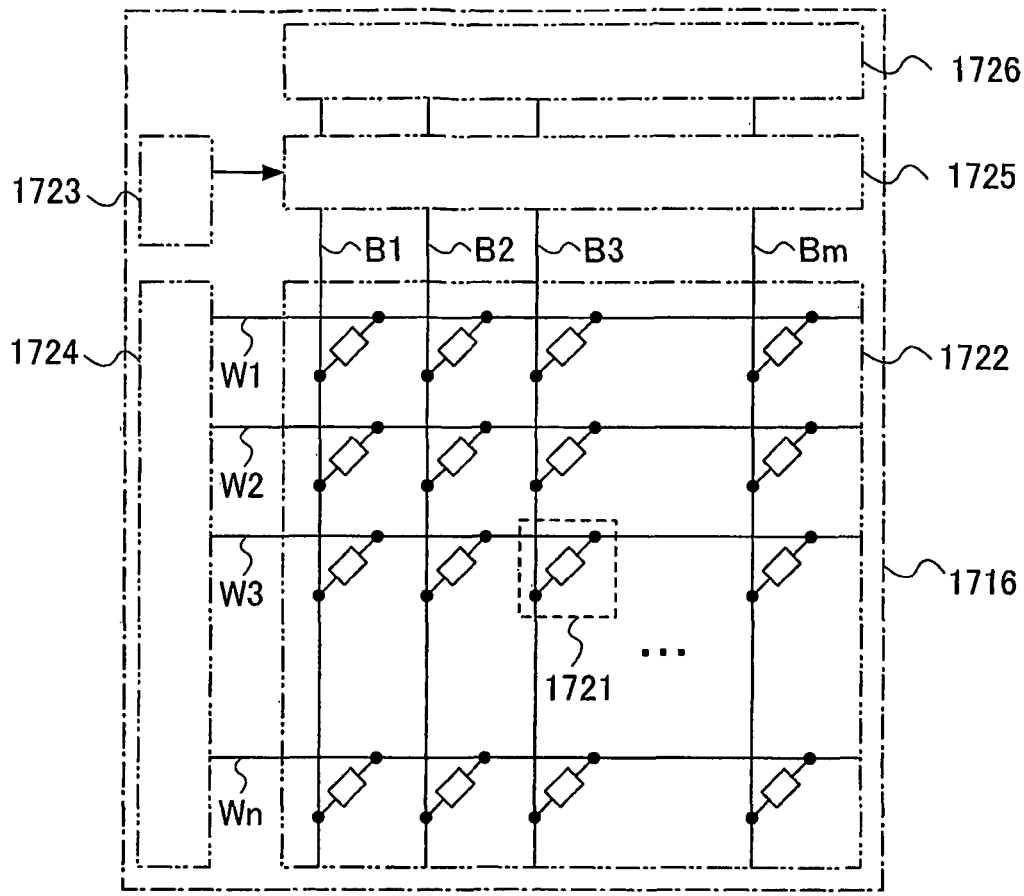
FIG. 18B
FIG. 18C
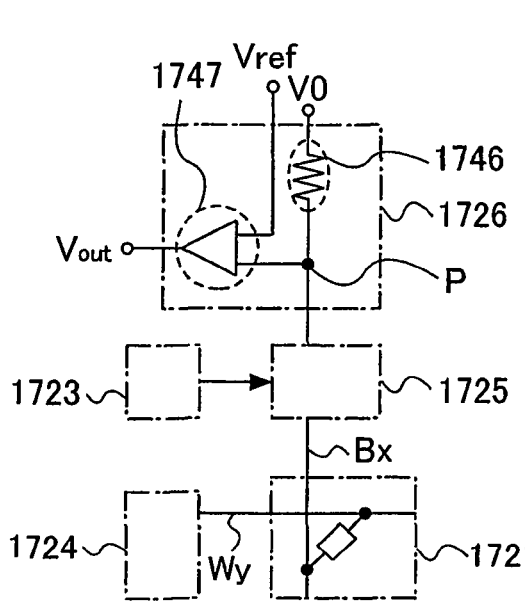
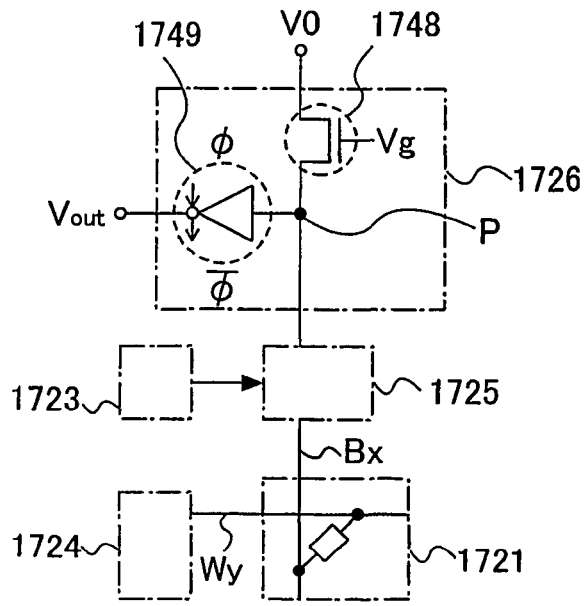

METHOD FOR MANUFACTURING A SEMICONDUCTOR DEVICE INCLUDING A MEMORY DEVICE COMPRISING AN INSULATOR MIXTURE REGION IN A CONDUCTIVE LAYER

TECHNICAL FIELD

The present invention relates to a semiconductor device and a manufacturing method of the semiconductor device.

BACKGROUND ART

In recent years, individual recognition technology has attracted attention. For example, there is technology to be used for production and management, in which information such as a history of the object is clarified by giving an ID (an identification code) to an individual object. Above all, the developments of semiconductor devices capable of wirelessly transmitting and receiving data have been advanced. As such semiconductor devices, particularly, an RFID (Radio Frequency Identification) (also referred to as an ID tag, an IC tag, an IC chip, an RF (Radio Frequency) tag, a wireless tag, an electronic tag, or a wireless chip), and the like have been beginning to be introduced into companies, markets, and the like.

Many of the semiconductor devices have a circuit using a semiconductor substrate such as a silicon (Si) substrate (hereinafter, also referred to as an IC (Integrated Circuit) chip) and an antenna, and the IC chip includes a memory circuit (hereinafter, also referred to as a memory), a control circuit, and the like. Further, organic thin film transistors (hereinafter, also referred to as a TFT) or organic memories using organic compounds for the control circuits and memory circuits have been actively developed (for example, see Patent Document 1).

Japanese Patent Laid-Open No. 7-22669 bulletin

DISCLOSURE OF INVENTION

However, in a memory circuit using an organic compound in which a memory element is formed by providing an organic compound between a pair of electrodes, current does not flow easily when the organic compound layer has a large thickness depending on the size of the memory circuit, and thus the rise in writing voltage becomes a problem. On the other hand, when the size of the element is small and the film thickness of the organic compound layer is small, the effect of dust and unevenness of an electrode layer surface becomes problems. Consequently, problems occur in that the characteristics (writing voltage and the like) of the memory vary and writing cannot be performed normally.

Therefore, it is an object of the present invention to provide a memory device having a high-performance and highly reliable memory element and a method of manufacturing a semiconductor device having the memory device at low cost with high yield.

The present invention provides a semiconductor device including a memory element where an organic compound layer is sandwiched between a pair of conductive layers. An insulator is provided between the organic compound layer and at least one of the conductive layers, and the least one of the conductive layers includes an insulator. In the present invention, insulators are included in a conductive layer by co-evaporation with a conductive material, adding to the conductive layer (by doping, ion implantation method, or the like), and a surface reforming treatment to the conductive layer. The shape of insulators in a conductive layer depends on its material and manufacturing method, and the concentration of the insulators can be controlled in accordance with its material and manufacturing method. Therefore, insulators may be distributed in a conductive layer uniformly, or distributed in a conductive layer so as to have different concentrations within the conductive layer. By insulators at the interface of a conductive layer and an organic compound layer, tunnel injection is enabled, and tunneling current flows. Therefore, when a voltage is applied between a first conductive layer and a second conductive layer, current flows through an organic compound layer and heat is generated. Then, when the temperature of an organic compound layer rises to the glass-transition temperature, a material forming the organic compound layer becomes a composition having fluidity. The composition having fluidity flows without maintaining the shape of a solid state. Therefore, the thickness of the organic compound layer is varied by Joule heat and the effect of a high electric field, and the organic compound layer is transformed to cause short-circuit between the first conductive layer and the second conductive layer. Accordingly, conductivity of the memory element changes before and after applying voltage.

In addition, when insulators are mixed into a conductive layer, physical impact can be avoided as compared to the case in which an organic compound layer is formed on a conductive layer. Therefore, film separation and defective shape are hard to occur. Therefore, because the insulators are provided at the interface of the conductive layer and the organic compound layer in a stable state, the manufacturing of a defective element where conductive layers are short-circuited in an initial state can be prevented, and yield improves. In addition, since insulators which are less subject to damage are mixed in the conductive layer or insulators are combined with the conductive layer, the flexibility of a process which is chosen with considering the fragileness of film is extended. Therefore, a memory element and a semiconductor device can be manufactured more efficiently, and reduction of production cost and enhancement of productivity can be achieved. A memory element of the present invention, which is resistant to physical impact, can be applied to freely bendable flexible semiconductor devices formed over a flexible substrate, and it is favorable.

It is to be noted that a semiconductor device in this specification indicates a device that can operate by utilizing semiconductor characteristics. A semiconductor device such as an integrated circuit having multilayer wiring layers and a processor chip can be manufactured using the present invention.

A semiconductor device according to the present invention has a memory element having a first conductive layer including an insulator, an organic compound layer over the first conductive layer including the insulator, and a second conductive layer over the organic compound layer.

A semiconductor device according to the present invention has a memory element having a first conductive layer, an organic compound layer over the first conductive layer, and a second conductive layer including an insulator over the organic compound layer.

A semiconductor device according to the present invention has a memory element including a first conductive layer having a first insulator, an organic compound layer over the first conductive layer including the first insulator, and a second conductive layer including a second insulator over the organic compound layer.

A method for manufacturing a semiconductor device according to the present invention has the steps of forming a first conductive layer including an insulator, forming an organic compound layer over the first conductive layer including the insulator, and forming a second conductive layer over the organic compound layer, thereby forming a memory element.

A method for manufacturing a semiconductor device according to the present invention has the steps of forming a first conductive layer, forming an organic compound layer over the first conductive layer, and forming a second conductive layer including an insulator over the organic compound layer, thereby forming a memory element.

A method for manufacturing a semiconductor device according to the present invention has the steps of forming a first conductive layer including a first insulator, forming an organic compound layer over the first conductive layer including the first insulator, and forming a second conductive layer including a second insulator over the organic compound layer, thereby forming a memory element.

A method for manufacturing a semiconductor device according to the present invention has the steps of forming a first conductive layer, forming the first conductive layer including an insulator by adding the insulator in the first conductive layer, forming an organic compound layer over the first conductive layer including the insulator, and forming a second conductive layer over the organic compound layer, thereby forming a memory element.

A method for manufacturing a semiconductor device according to the present invention has the steps of forming a first conductive layer, forming an insulator mixture region in the first conductive layer by modifying a part of the surface of the first conductive layer, forming an organic compound layer over the insulator mixture region, and forming a second conductive layer over the organic compound layer, thereby forming a memory element.

A method for manufacturing a semiconductor device according to the present invention has the steps of forming a first conductive layer, adding a metal element or a semiconductor element to the first conductive layer, forming the first conductive layer including an insulator by oxidizing the metal element or the semiconductor element, forming an organic compound layer over the first conductive layer including the insulator, and forming a second conductive layer over the organic compound layer, thereby forming a memory element.

A method for manufacturing a semiconductor device according to the present invention has the steps of forming a first conductive layer, forming the first conductive layer including a first insulator by adding the first insulator in the first conductive layer, forming an organic compound layer over the first conductive layer including the first insulator, and forming a second conductive layer including a second insulator over the organic compound layer, thereby forming a memory element.

A method for manufacturing a semiconductor device according to the present invention has the steps of forming a first conductive layer, forming a first insulator mixture region in the first conductive layer by modifying a part of the surface of the first conductive layer, forming an organic compound layer over the first insulator mixture region, and forming a second conductive layer including a second insulator over the organic compound layer, thereby forming a memory element.

A method for manufacturing a semiconductor device according to the present invention has the steps of forming a first conductive layer, adding a metal element or a semiconductor element to the first conductive layer, forming the first conductive layer including an insulator by oxidizing the metal element or the semiconductor element, forming an organic compound layer over the first conductive layer including the insulator, and forming a second conductive layer including a second insulator over the organic compound layer, thereby forming a memory element.

According to the present invention, a high-performance and highly reliable memory device and semiconductor device can be manufactured at low cost with high yield.

BRIEF DESCRIPTION OF DRAWINGS

FIGS. 18A to 18C are diagrams explaining a memory device of the present invention.

BEST MODE FOR CARRYING OUT THE INVENTION

Embodiment Mode

Figure 1A:
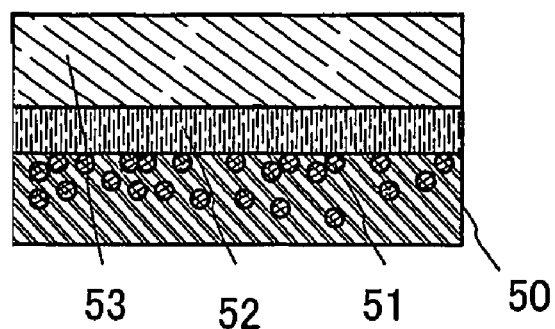
FIGS. 1A to 1C are conception diagram explaining the present invention.

Embodiment Modes of the present invention will be described with reference to drawings. Although the invention will be described by way of Embodiment Mode and Embodiments with reference to the accompanying drawings, it is to be understood that various changes and modifications will be apparent to those skilled in the art. Therefore, unless such changes and modifications depart from the scope of the invention, they should be construed as being included therein. It is to be noted that, in the structure of the present invention, the same portion or a portion having the same function is denoted by the same reference numeral in all drawings, and the description thereof is omitted.

Embodiment Mode 1

In this embodiment mode, an example of a structure of a memory element included in a memory device according to the present invention will be described with reference to drawings.

A memory element according to the present invention and an operation mechanism thereof will be described with reference to FIGS. 1A to 1C. In the present invention, a memory element included in a memory device is formed so that a plurality of insulators is formed between an organic compound layer and at least one of a pair of conductive layers sandwiching the organic compound layer, and at least one of the pair of conductive layers includes a plurality of insulators. By interposing the plurality of insulators between the conductive layer and the organic compound layer, the characteristics of a memory element do not vary but are stabilized, and writing can be performed normally.

Insulators are included in a conductive layer by co-evaporation with a conductive material, adding to the conductive layer (by doping, ion implantation method, or the like), and a surface reforming treatment to the conductive layer. The shape of the insulators in the conductive layer depends on its material and manufacturing method, and the concentration of the insulators can be controlled in accordance with its material and manufacturing method.

A memory element shown in FIG. 1A is an example of a memory element of the present invention, and an organic compound layer 52 is formed on a first conductive layer 50 including insulators 51, and a second conductive layer 53 is formed on the organic compound layer 52. The insulators 51 are located in the first conductive layer 50 at the interface of the first conductive layer 50 and the organic compound layer 52.

Figure 1B:
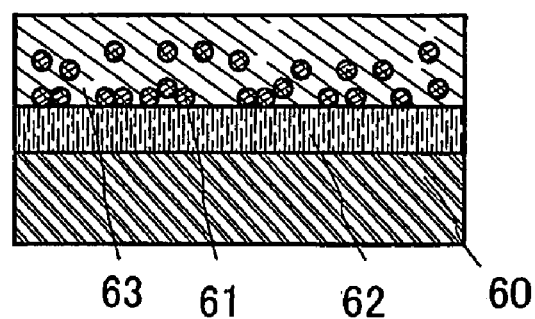

A memory element shown in FIG. 1B is an example of a memory element of the present invention, and an organic compound layer 62 is formed on a first conductive layer 60 including insulators 61, and a second conductive layer 63 is formed on the organic compound layer 62. The insulators 61 are located in the second conductive layer 63 at the interface of the second conductive layer 63 and the organic compound layer 62.

Figure 1C:
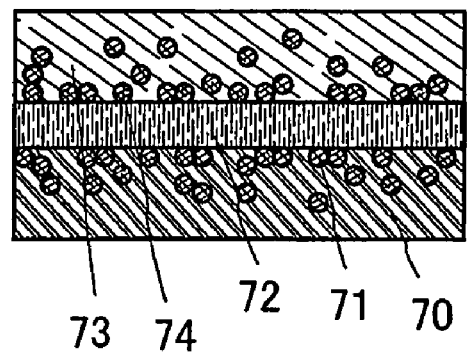

A memory element shown in FIG. 1C is an example of a memory element of the present invention, and an organic compound layer 72 is formed on a first conductive layer 70 including first insulators 71, and a second conductive layer 73 including second insulators 74 is formed on the organic compound layer 72. The insulators 71 are located in the first conductive layer 70 at the interface of the first conductive layer 70 and the organic compound layer 72, and the insulators 74 are located in the second conductive layer 73 at the interface of the second conductive layer 73 and the organic compound layer 72.

In the memory elements of FIGS. 1A, 1B, and 1C, the insulators 51, 61, 71, and 74 which are included in the first conductive layer 50, the second conductive layer 63, the first conductive layer 70 and the second conductive layer 73 respectively, are presented with spherical particles to show clearly that the insulators are mixed. However, the insulators are not limited to the shape, and the shape of insulators may be granulated, columnar, needle-like, board-like, or any kind of shape. A plurality of insulators may be aggregated to make a unit.

As a material for the first conductive layers 50, 60, and 70, and the second conductive layers 53, 63, and 73, an element or a compound that has high conductivity, or the like is used. In this embodiment mode, as a material for the organic compound layers 52, 62, and 72, a substance that changes in crystalline state, conductivity, and the shape by electrical action is used. Since a memory element having the structure described above has conductivity that changes before and after applying voltage, the memory element can store two values corresponding to "initial state" and "after change of conductivity". The change in conductivity of the memory element before and after applying voltage will be described.

In this embodiment mode, the first conductive layer 50 including the insulators 51, which forms a memory element included in a memory device, is formed, and the organic compound layer 52 is formed in contact with the first conductive layers 50 and the insulators 51. When voltage is applied between the first conductive layer 50 and the second conductive layer 53, current also flows through the organic compound layer 52 and heat is generated. Then, when the temperature of the organic compound layer rises to the glass-transition temperature, a material forming the organic compound layer 52 becomes a composition having fluidity. The composition having fluidity flows without maintaining the shape of a solid state. Therefore, the thickness of the organic compound layer is uneven by Joule heat and the effect of a high electric field, and the organic compound layer is transformed so that the first conductive layer and the second conductive layer are in contact with each other. As a result, the first conductive layer 50 and the second conductive layer 53 are short-circuited. Accordingly, the conductivity of the memory element changes before and after applying voltage.

Due to the insulators 51 formed at the interface of the organic compound layer 52 and the first conductive layer 50, tunnel injection of carriers from the first conductive layer 50 to the organic compound layer 52 is enabled. Therefore, the characteristics of a writing voltage of a memory element are stable without variation, and writing can be performed normally in each element.

In addition, when insulators are mixed into a conductive layer, physical impact can be avoided during a manufacturing process as compared to the case in which a single organic compound layer is formed on the conductive layer. Therefore, film separation and defective shape are hard to occur. Therefore, because the insulators are provided at the interface of the conductive layer and the organic compound layer in a stable state, the manufacturing of a defective element which is short-circuited (short) among conductive layers in an initial state can be prevented, and yield improves. In addition, due to a state that a plurality of insulators are mixed in the conductive layer or a form that complexing a plurality of insulators and the conductive layer, the flexibility of a process, which is chosen with considering the robustness of film, is extended. Therefore, a memory element and a memory device can be manufactured more efficiently, and reduction of production cost and enhancement of productivity can be achieved.

As shown in FIG. 1B, the insulators 61 may be mixed into the second conductive layer 63, and it may be located at the interface with the organic compound layer 62. Similarly to the memory element of FIG. 1A, the insulators 61 located at the interface of the organic compound layer 62 and the second conductive layer 63 allow tunnel injection of carriers from the organic compound layer 62 to the second conductive layer 63 is enabled.

In addition, as shown in FIG. 1C, the insulators 71 and 74 may be mixed in the first conductive layer 70 and the second conductive 73 layer respectively, and the insulators may be located at the interface of the first conductive layer 70 and the organic compound layer 72, and the interface of the organic compound layer 72 and the second conductive layer 73. Similarly to the memory element of FIG. 1A, the insulators 71 located at the interface of the first conductive layer 70 and the organic compound layer 72 allow tunnel injection of carriers from the first conductive layer 70 to the organic compound layer 72. Similarly to the memory element of FIG. 1B, the insulators 74 located at the interface of the organic compound layer 72 and the second conductive layer 73 allow tunnel injection of carriers from the organic compound layer 72 to the second conductive layer 73. The same material may be used for the insulator 71 included in the first conductive layer 70 and the insulator 74 included in the second conductive layer 73, different materials may also be used.

Note that a voltage applied to a memory element of the present invention may be higher in the first conductive layer than the second conductive layer, and the voltage may be higher in the second conductive layer than the first conductive layer. In the case of a memory element having rectification properties, a potential difference may be provided between the first conductive layer and the second conductive layer in order that a forward-bias voltage may be applied, or a potential difference may be provided between the first conductive layer and the second conductive layer in order that a reverse-bias voltage can be applied.

In the present invention, a pair of conductive layers provided to sandwich an organic compound layer, in which at least one conductive layer which is mixed with a plurality of insulators, are used as electrodes of a memory element. A mixture state of a plurality of insulators in a conductive layer is different depending on a material or a forming method to be used. The conductive layers including a plurality of insulators shown in FIGS. 1A to 1C are examples that a plurality of particle-shaped insulators are distributed in the conductive layer, and the plurality of insulators are located at the interface of the conductive layer and the organic compound layer. FIG. 1 shows an example that the conductive layer including a plurality of insulators is formed by mixing a plurality of particle-shaped insulators into the conductive layer. An example that a conductive layer having an insulator mixture region is used in a memory element is explained using FIGS. 17A to 17C.

Figure 17A:
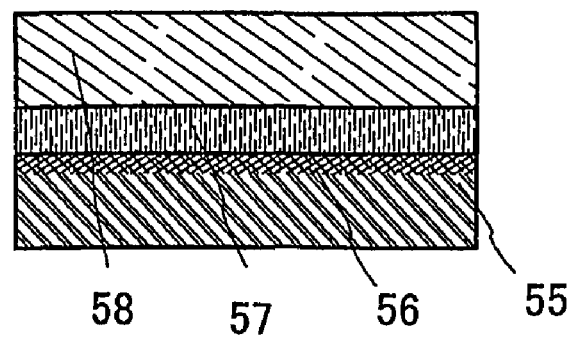
FIGS. 17A to 17C are diagrams explaining a memory device of the present invention.
Figure 17B:
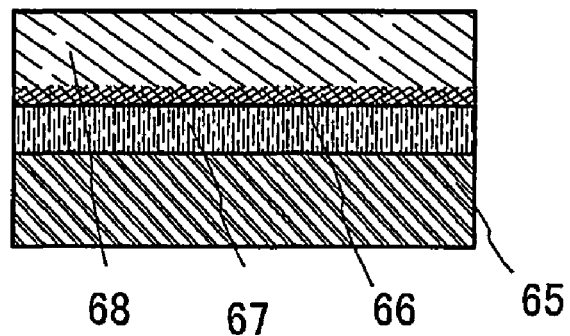
Figure 17C:
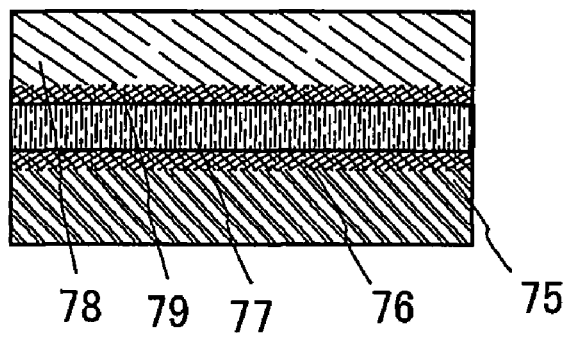

Memory elements in FIGS. 17A, 17B, and 17C are examples that an insulator mixture region is included in a conductive layer. In FIGS. 17A and 17C, an insulator mixture region is provided over the surface of a first conductive layer. In this case, a conductive layer having an insulator mixture region can be formed in one step by codeposition method or a sputtering method. Alternatively, after forming a conductive layer, a conductive layer having an insulator mixture region can be formed by modifying the surface of a conductive layer. A plurality of insulators in the conductive layer is located at the interface of the conductive layer and an organic compound layer, and the insulators have the effect of performing tunnel injection. Therefore, when an insulator mixture region is provided on the surface of a conductive layer by applying modification treatment to the surface of the conductive layer, an insulator mixture region can be formed at the interface of the conductive layer and an organic compound layer formed over the conductive layer. As surface treatment of the conductive layer, air oxidation, oxidation under oxygen atmosphere, fluorination with medicinal solution, or the like may be performed.

A memory element shown in FIG. 17A is an example of a memory element of the present invention, where an organic compound layer 57 is formed over a first conductive layer 55 having an insulator mixture region 56, and a second conductive layer 58 is formed over the organic compound layer 57. An insulator to be mixed in the conductive layer 55 has a concentration gradient and a plurality of insulators is located in the conductive layer 55 unevenly. The insulator mixture region 56 is located in the vicinity of the interface of the organic compound layer 57 and the first conductive layer 55. Therefore, the concentration of the insulators is the highest at the interface of the organic compound layer 57 and the first conductive layer 55. The insulator mixture region does not have a definitive interface with a non-insulator mixture region, and the concentration of the insulators gradually decreases as the distance from the organic compound layer 57 increases in the direction of the film thickness in the first conductive layer 55.

A memory element shown in FIG. 17B is an example of a memory element of the present invention, where an organic compound layer 67 is formed over a first conductive layer 65, and a second conductive layer 68 having an insulator mixture region 66 is formed over the organic compound layer 67. An insulator to be mixed in the organic compound layer 67 has a concentration gradient, and a plurality of insulators is present in the second conductive layer 68 unevenly. Therefore, the concentration of the insulators is the highest at the interface of the organic compound layer 67 and the second conductive layer 68. The insulator mixture region 66 is provided in the vicinity of the interface of the organic compound layer 67 and the second conductive layer 68. The insulator mixture region does not have a definitive interface with a non-insulator mixture region, and the concentration of the insulators gradually decreases as the distance from the organic compound layer 67 increases in the direction of the film thickness in the second conductive layer 68.

A memory element shown in FIG. 17C is an example of a memory element of the present invention, where an organic compound layer 77 is formed over a first conductive layer 75 having an insulator mixture region 76, and a second conductive layer 78 having an insulator mixture region 79 is formed over the organic compound layer 77. The insulators which are mixed in each of the first conductive layer 75 and the second conductive layer 78 have a concentration gradient, and the plurality of insulators are distributed unevenly in the first conductive layer 75 and the second conductive layer 78. In the first conductive layer 75, the insulator mixture region 76 is provided in the vicinity of the interface with the organic compound layer 77, and in the second conductive layer 78, the insulator mixture region 79 is provided in the vicinity of the interface with the organic compound layer 77. Therefore, the concentration of the insulators is the highest at the interface of the organic compound layer 77 and the first conductive layer 75, and the interface of the organic compound layer 77 and the second conductive layer 78. The insulator mixture region does not have a definitive interface with a non-insulator mixture region, the concentration of the insulators gradually decrease as the distance from the organic compound layer 77 increases in the direction of the film thickness in the first conductive layer 75 and the second conductive layer 78.

A conductive layer including a plurality of insulators may be formed in a single step by mixing a plurality of insulators and conductive materials, or one of a plurality of insulators and conductive materials can be added first and the other may be mixed (added) in another step. In the case of forming the conductive layer in a single step, dry process such as a codeposition method or a sputtering method may be used, and the conductive layer may be formed in a film shape by wet process such as an application method using mixture materials of a plurality of insulators and conductive materials. The distribution of insulators in the conductive layer can be controlled to have a desired concentration by the aforementioned forming method.

A conductive layer including insulators can be formed using an electron beam evaporation method, an evaporation method such as codeposition, a sputtering method, a CVD method, a spin coating method using a mixture solution, and a sol-gel method. The conductive layer including insulators can be formed by concurrently depositing each material. For example, the conductive layer can be formed by combining the same or different kinds of methods such as coevaporation by resistance heating evaporation, coevaporation by electron beam evaporation, coevaporation by resistance heating evaporation and electron beam evaporation, deposition by resistance heating evaporation and sputtering, or deposition by electron beam evaporation and sputtering. Also, a droplet discharging (ejecting) method (also referred to as an ink-jetting method depending on its mode) capable of forming a predetermined pattern by selectively discharging (ejecting) a droplet of a composition mixed for a particular purpose; a dispenser method; and a method capable of transferring or drawing an object into a desired pattern, for example, various printing methods (a method for forming a desired pattern, such as screen (mimeograph) printing, offset (lithography) printing, relief printing, and gravure (intaglio) printing) can be used. In addition, a conductive layer and insulators are not necessarily formed at the same time, but after forming a conductive layer, a plurality of insulators may be added by an ion implantation method, an ion doping method, or the like to form a mixture layer of the insulators and a conductive material. After forming a conductive layer, a conductive layer having an insulator mixture region may be formed by modifying the surface.

Figure 16A:
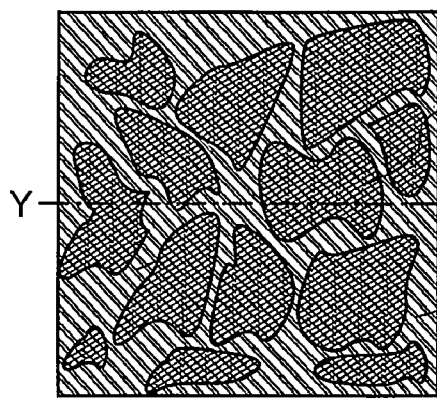
FIGS. 16A to 16D are diagrams explaining a memory device of the present invention.
Figure 16B:
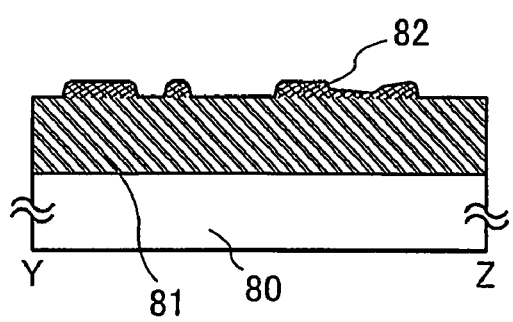

After forming a conductive layer having an insulator mixture region, the surface of the conductive layer may be processed in a desired shape by etching such as dry etching or wet etching, and a process to shave the surface may be performed. By processing an insulator mixture region to a desired shape, the quantity and the concentration of insulators which are adjacent to an organic compound layer and provided at the interface with the organic compound layer can be controlled. The shape of a conductive layer including an insulator which can be used in the present invention is explained using FIGS. 16A to 16D. In FIGS. 16A and 16B, a first conductive layer 81 having an insulator mixture region 82 is formed over a substrate 80. As shown in FIGS. 16A and 16B, an insulator mixture region is selectively formed in the first conductive layer 81, and the insulator mixture region does not has continuity as a film to have a discontinuous island-like shape in some cases. As can be seen in FIG. 16B which is a sectional view taken along a line Y-Z of FIG. 16A which is a top view, the first conductive layer 81 having the island-like insulator mixture region 82 has a difference in its thickness, and may have a concave and convex shapes on its surface.

Figure 16C:
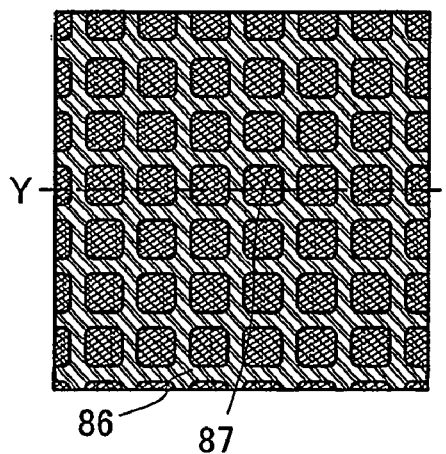
Figure 16D:
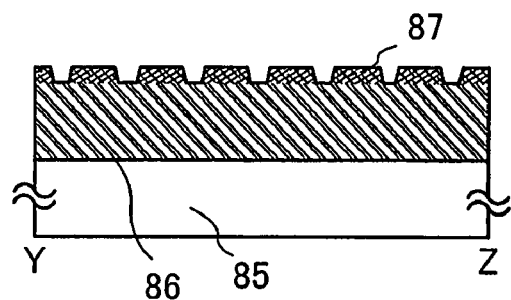

FIGS. 16C and 16D are examples that an insulator mixture region 87 is formed in an ordered island-like shape at a regular position. FIG. 16C is a top view, and FIG. 16D is a cross-sectional view taken along a line Y-Z in FIG. 16C. In FIGS. 16C and 16D, a first conductive layer 86 having an insulator mixture region 87 is formed over a substrate 85. As shown in FIGS. 16C and 16D, the insulator mixture region 87 may be formed at a regular position so as to be an ordered island-like shape having planarity.

Naturally, a method in which an insulator mixture region is selectively formed in a conductive layer may be used without performing the aforementioned etching process.

In the present invention, a conductive layer including insulators may include with at least one kind of insulators mixed into the surface of the conductive layer. Therefore, the mixture ratio and the mixture state of a plurality of insulators and a conductive material may be appropriately set according to materials and needed functions. For example, a plurality of insulators and a conductive material may be mixed uniformly in a mixture layer, or they may be mixed unevenly with the distribution of mixture ratio. In addition, the insulator mixture region in a conductive layer including insulators of the present invention may have a discontinuous island-like shape, in this case, the mixture state and the concentration of insulators and a conductive material may be different for each island-shape layer.

In addition, a memory element of the present invention has a structure in which an organic compound layer is stacked over a conductive layer including a plurality of insulators so as to be in contact with the insulators. In such a stacked-layer structure, the interface of the conductive layer including insulators and an organic compound layer is not required to be a continuous interface clearly. For example, an interface, on which an organic compound layer may be formed so that unevenness on the surface of a conductive layer including insulators may be buried.

In the present invention, as a plurality of insulators mixed into a conductive layer, an inorganic insulator or an organic compound which is stable thermally and chemically. Preferably, an insulator mixed into an organic compound layer, which has an electric conductivity of $10^{-10}$ s/m or lower, and more preferably $10^{-10}$ to $10^{-14}$ s/m, can be used. Examples of an inorganic insulator and an organic compound which are used as an insulator are specifically mentioned below.

In the present invention, as an inorganic insulator which can be used for an insulator mixed in a conductive layer, there is oxide such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), barium oxide (BaO), scandium oxide ($Sc_2O_3$), zirconium oxide ($ZrO_2$), hafnium oxide ($HfO_2$), rutherfordium oxide ($RfO_2$), tantalum oxide (TaO), technetium oxide (TcO), iron oxide ($Fe_2O_3$), cobalt oxide (CoO), palladium oxide (PdO), silver oxide ($Ag_2O$), aluminum oxide ($Al_2O_3$), gallium oxide ($Ga_2O_3$), and bismuth oxide ($Bi_2O_3$).

In the present invention, as other inorganic insulators which can be used for an insulator mixed into a conductive layer, there is fluoride such as lithium fluoride (LiF), sodium fluoride (NaF), potassium fluoride (KF), rubidium fluoride (RbF), berylium fluoride ($BeF_2$), magnesium fluoride ($MgF_2$), calcium fluoride ($CaF_2$), strontium fluoride ($SrF_2$), barium fluoride ($BaF_2$), aluminium fluoride ($AlF_3$), nitrogen trifluoride ($NF_3$), sulfur hexafluoride ($SF_6$), silver fluoride (AgF), and manganese fluoride ($MnF_3$).

In the present invention, as other inorganic insulators which can be used for an insulator mixed into a conductive layer, there is chlorides such as lithium chloride (LiCl), sodium chloride (NaCl), potassium chloride (KCl), berylium chlorination ($BeCl_2$), calcium chloride ($CaCl_2$), barium chloride ($BaCl_2$), aluminum chloride ($AlCl_3$), silicon chloride ($SiCl_4$), germanium chloride ($GeCl_4$), tin chloride ($SnCl_4$), silver chloride (AgCl), zink chloride (ZnCl), titanium tetrachloride ($TiCl_4$), titanium trichloride ($TiCl_3$), zirconium chloride ($ZrCl_4$), iron chloride ($FeCl_3$), palladium dichloride ($PdCl_2$), antimony chloride ($SbCl_3$), antimony dichloride ($SbCl_2$), strontium dichloride ($SrCl_2$), thallium chloride (TlCl), copper chloride (CuCl), manganese chloride ($MnCl_2$), and ruthenium chloride ($RuCl_2$).

In the present invention, as other inorganic insulators which can be used for an insulator mixed into a conductive layer, there is bromides such as potassium bromide (KBr), cesium bromide (CsBr), silver bromide (AgBr), barium bromide ($BaBr_2$), silicon bromide ($SiBr_4$), and lithium bromide (LiBr).

In the present invention, as other inorganic insulators which can be used for an insulator mixed into a conductive layer, there is iodide such as sodium iodide (NaI), potassium iodide (KI), barium iodide ($BaI_2$), thallium iodide (TlI), silver iodide (AgI), titanium iodide ($TiI_4$), calcium iodide ($CaI_2$), silicon iodide ($SiI_4$), and cesium iodide (CsI).

In the present invention, as other inorganic insulators which can be used for an insulator mixed into conductive layer, there is carbonate such as lithium carbonate ($Li_2CO_3$), potassium carbonate ($K_2CO_3$), sodium carbonate ($Na_2CO_3$), magnesium carbonate ($MgCO_3$), calcium carbonate ($CaCO_3$), strontium carbonate ($SrCO_3$), barium carbonate ($BaCO_3$), manganese carbonate ($MnCO_3$), iron carbonate ($FeCO_3$), cobalt carbonate ($CoCO_3$), nickel carbonate ($NiCO_3$), copper carbonate ($CuCO_3$), silver carbonate ($Ag_2CO_3$), and zinc carbonate ($ZnCO_3$).

In the present invention, as other inorganic insulators which can be used for an insulator mixed into a conductive layer, there is sulfate such as lithium sulfate ($Li_2SO_4$), potassium sulfate ($K_2SO_4$), sodium sulfate ($Na_2SO_4$), magnesium sulfate ($MgSO_4$), calcium sulfate ($CaSO_4$), strontium sulfate ($SrSO_4$), barium sulfate ($BaSO_4$), titanium sulfate ($Ti_2(SO_4)_3$), zirconium sulfate ($Zr(SO_4)_2$), manganese sulfate ($MnSO_4$), iron sulfate ($FeSO_4$), terric trisulfate iron ($Fe_2(SO_4)_3$), cobalt sulfate ($CoSO_4$), cobalt sulfate ($Co_2(SO_4)_3$), nickel sulfate ($NiSO_4$), copper sulfate ($CuSO_4$), sulfuric acid silver ($Ag_2SO_4$), zinc sulfate ($ZnSO_4$), aluminium sulfate ($Al_2(SO_4)_3$), indium sulfate ($In_2(SO_4)_3$), tin sulfate ($SnSO_4$), tin sulfate ($Sn(SO_4)_2$), antimony sulfate ($Sb_2(SO_4)_3$), and bismuth sulfate ($Bi_2(SO_4)_3$).

In the present invention, as other inorganic insulators which can be used for an insulator mixed into a conductive layer, there is nitrate such as lithium nitrate ($LiNO_3$), potassium nitrate ($KNO_3$), sodium nitrate ($NaNO_3$), magnesium nitrate ($Mg(NO_3)_2$), calcium nitrate ($Ca(NO_3)_2$), strontium nitrate ($Sr(NO_3)_2$), barium nitrate ($Ba(NO_3)_2$), titanium nitrate ($Ti(NO_3)_4$), strontium nitrate ($Sr(NO_3)_2$), barium nitrate ($Ba(NO_3)_2$), zirconium nitrate ($Zr(NO_3)_4$), manganese nitrate ($Mn(NO_3)_2$), iron nitrate ($Fe(NO_3)_2$), iron nitrate ($Fe(NO_3)_3$), cobalt nitrate ($Co(NO_3)_2$), nickel nitrate ($Ni(NO_3)_2$), copper nitrate ($Cu(NO_3)_2$), silver nitrate ($AgNO_3$), zinc nitrate ($Zn(NO_3)_2$), aluminium nitrate ($Al(NO_3)_3$), indium nitrate ($In(NO_3)_3$), tin nitrate ($Sn(NO_3)_2$), and bismuth nitrate ($Bi(NO_3)_3$).

In the present invention, as other inorganic insulators which can be used for an insulator mixed into a conductive layer, there is nitride such as aluminum nitride (AlN), and silicon nitride (SiN), or carboxylate such as lithium acetate ($CH_3COOLi$), potassium acetate ($CH_3COOK$), sodium acetate ($CH_3COONa$), magnesium acetate (($CH_3COO)_2Mg$), calcium acetate (($CH_3COO)_2Ca$), strontium acetate (($CH_3COO)_2Sr$), and barium acetate (($CH_3COO)_2Ba$).

In present invention, as an inorganic insulator which can be used for the insulator mixed to conductive layer, one or several kinds of the aforementioned inorganic insulators.

In present invention, as an organic compound which can be used for the insulators mixed into a conductive layer, a material in which it is hard that a carrier is injected and a material having a band gap of 3.5 eV or more, preferably 4 eV or more and 6 eV or less, can be used. For example, polyimide, acryl, polyamide, benzocyclobutene, polyester, novolac resin, melamine resin, phenol resin, epoxy resin, silicone resin, franc resin, diallyl phthalate resin, and siloxane resin can be used. It is to be noted that the siloxane resin corresponds to a resin including a Si—O—Si bond. Siloxane has a skeleton structure formed by a bond of silicon (Si) and oxygen (O). As a substituent, an organic group containing at least hydrogen (for example, an alkyl group or aromatic hydrocarbon) is used. As a substituent, a fluoro group may be used. In addition, as a substituent, an organic group containing at least hydrogen and a fluoro group may be used.

In the present invention, as an organic compound which can be used for an insulator mixed into a conductive layer, there is one or several kinds of the aforementioned organic compounds can be used.

In the present invention, as an insulator mixed into a conductive layer, one or several kinds of the aforementioned inorganic insulators and organic compounds can be used.

As the first conductive layers 50, 60, and 70, and the second conductive layers 53, 63, and 73, an element or a compound that has high conductivity, or the like is used. Typically, a single layer or a stacked layer containing an element or an alloy containing a plurality of elements selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), and tantalum (Ta) can be used. As the alloy containing a plurality of the elements, for example, an alloy containing Al and Ti, an alloy containing Al, Ti, and C, an alloy containing Al and Ni, an alloy containing Al and C, an alloy containing Al, Ni, and C, an alloy containing Al and Mo, or the like can be used.

When a conductive layer including insulators is formed using a stacked-layer structure, the insulators may be mixed into all of a plurality of stacked layers, or the insulators may be mixed in at least a conductive layer which is in contact with an organic compound layer. For example, when the first conductive layer 50 has a stacked layer structure of two conductive layers, insulators may be mixed in the most upper conductive layer which is in contact with the organic compound layer 52, and in a lower conductive layer it is not require to be mixed with insulators. In this case, an insulator mixture region is formed over the surface of the upper conductive layer using a conductive material which is easily oxidized, and a conductive material having low resistivity can be used for the lower conductive layer in order that electric characteristics as an electrode and a wire may be satisfied.

The first conductive layers 50, 60, 70, 55, 65, and 75, and the second conductive layers 53, 63, 73, 58, 68, and 78 can be formed by using an evaporation method, a sputtering method, a CVD method, a printing method, a dispenser method, or a droplet discharging method.

One or both of the first conductive layers 50, 60, 70, 55, 65, and 75, and the second conductive layers 53, 63, 73, 58, 68, and 78 may be provided so as to have light-transmitting property. The light-transmitting conductive layer may be formed using a transparent conductive material, or with a thickness to transmit light when the transparent conductive material is not used. As a transparent conductive material, indium tin oxide (ITO), zinc oxide (ZnO), indium zinc oxide (IZO), zinc oxide added with gallium (GZO), indium oxide including tungsten oxide, indium zinc oxide including tungsten oxide, indium oxide including titanium oxide, indium tin oxide including titanium oxide, or other light-transmitting oxide conductive materials can be used. Indium tin oxide containing silicon oxide (hereinafter, referred to as ITSO), or an oxide conductive material formed using a target in which zinc oxide (ZnO) of 2 to 20 wt % is mixed into indium oxide containing silicon oxide may be used.

The organic compound layers 52, 62, 72, 57, 67, and 77 are formed of an organic compound, an organic compound whose conductivity changes by an electrical effect, or a mixed layer of an organic compound and an inorganic compound.

As an inorganic compound that can form the above-mentioned mixed layer of the organic compound layer and the inorganic compound layer, silicon oxide, silicon nitride, silicon oxynitride, silicon nitride oxide, and the like can be used.

As an organic compound that can form the organic compound layers 52, 62, 72, 57, 67, and 77, an organic resin represented by polyimide, acryl, polyamide; benzocyclobutene, epoxy, and the like can be used.

As an organic compound that can form the organic compound layers 52, 62, 72, 57, 67, and 77, whose conductivity changes by an electrical effect, an organic compound material having a hole-transporting property, or an organic compound material having an electron-transporting property can be used.

As an organic compound material having a hole-transporting property, an aromatic amine-based compound (in other words, a compound having a benzene ring-nitrogen bond) such as 4,4'-bis[N-(1-naphthyl)-N-phenylamino]biphenyl (abbr.: a-NPD), 4,4'bis[N-(3-methylphenyl)-N-phenylamino]biphenyl (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), or 4,4'-bis(N-(4-(N,N-di-m-tolylamino)phenyl)-N-phenylamino)biphenyl (abbr.: DNTPD); or a phthalocyanine-based compound such as phthalocyanine (abbr.: $H_2Pc$), copper phthalocyanine (abbr.: CuPc), or vanadyl phthalocyanine (abbr.: VOPc) can be used. The substances mentioned here mainly have a hole mobility of $10^{-6}$ $cm^2/Vs$ or more, and preferably, $10^{-6}$ to $10^{-2}$ $cm^2/VS$.

As an organic compound material having an electron-transporting property, a material made of a metal complex having a quinoline skeleton, or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like can be used.

Alternatively, a material made of a metal complex having an oxazole or thiazole ligand, such as bis[2-(2-hydroxyphenyl)benzoxazolate]zinc (abbr.: $Zn(BOX)_2$) or bis[2-(2-hydroxyphenyl)benzothiazolate]zinc (abbr.: $Zn(BTZ)_2$), or the like can be used.

In addition to the metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used.

The substances mentioned here mainly have an electron mobility of $10^{-6}$ $cm^2/Vs$ or more, and preferably, $10^{-6}$ to $10^{-2}$ $cm^2/Vs$.

In the present invention, as organic compound materials which can be used for the organic compound layer, one or several kinds of the aforementioned organic compound materials can be used.

Note that the organic compound layers 52, 62, 72, 57, 67, and 77 are formed to have such a film thickness as the conductivity of a memory element varies by an electric effect.

An element having a rectifying property may be provided at the opposite side of the organic compound layers 52, 62, 72, 57, 67, and 77 through the first conductive layers 50, 60, 70, 55, 65 and 75. For example, diode including a third conductive layer and a semiconductor layer may be provided in contact with the first conductive layers 50, 60, 70, 55, 65, and 75. Note that an element having a rectifying property may be provided at the opposite side of the organic compound layer through the second conductive layer. An element having a rectifying property may be provided between the first conductive layers 50, 60, 70, 55, 65, and 75, and the organic compound layers 52, 62, 72, 57, 67, and 77. The element having a rectifying property is a transistor whose gate and drain electrodes are connected to each other, or a diode. For example, a PN junction diode provided by stacking an n-type semiconductor layer and a p-type semiconductor layer can be used. In this manner, since current flows only in one direction by providing the diode having a rectifying property, errors are reduced and reading margin is improved. In the case of providing a diode, not only a diode having a PN junction but also a diode having another structure such as a diode having a PIN junction or an avalanche diode may be provided. Further, the aforementioned element having a rectifying property may be provided between the organic compound layers 52, 62, 72, 57, 67 and 77, and the second conductive layers 53, 63, 73, 58, 68, and 78. In the case of providing an element having a rectifying property, it is necessary to have a structure where insulators are mixed into at least one of a pair of conductive layers which are in contact with an organic compound layer in order that the insulators are provided at the interface of the conductive layer and the organic compound layer so as to be in contact with the organic compound layer.

By the present invention, characteristics of a memory element such as a writing voltage are not varied to be stabilized. Consequently, writing can be performed normally in each element. In addition, when a plurality of insulators is mixed into a conductive layer, physical impact can be avoided as compared to the case in which an organic compound layer is formed on the conductive layer. Therefore, film separation and defective shape are hard to occur. Because a plurality of insulators can be provided in a stable state at the interface of a conductive layer and an organic compound layer, a defective element where conductive layers are short-circuited in an initial state can be prevented from being manufactured, and highly reliable memory element and semiconductor device can be provided with high yield. In addition, since insulators are mixed into a conductive layer or insulators are combined with a conductive layer, the film is less subject to damage. Therefore, the flexibility of a process which is chosen is extended. Therefore, a memory element and a memory device can be manufactured more efficiently, and reduction of production cost and enhancement of productivity can be achieved.

Embodiment Mode 2

In this embodiment mode, an example of a structure of a memory element included in a memory device according to the present invention will be described with reference to drawings. Specifically, a structure of a passive matrix memory device will be shown.

Figure 3:
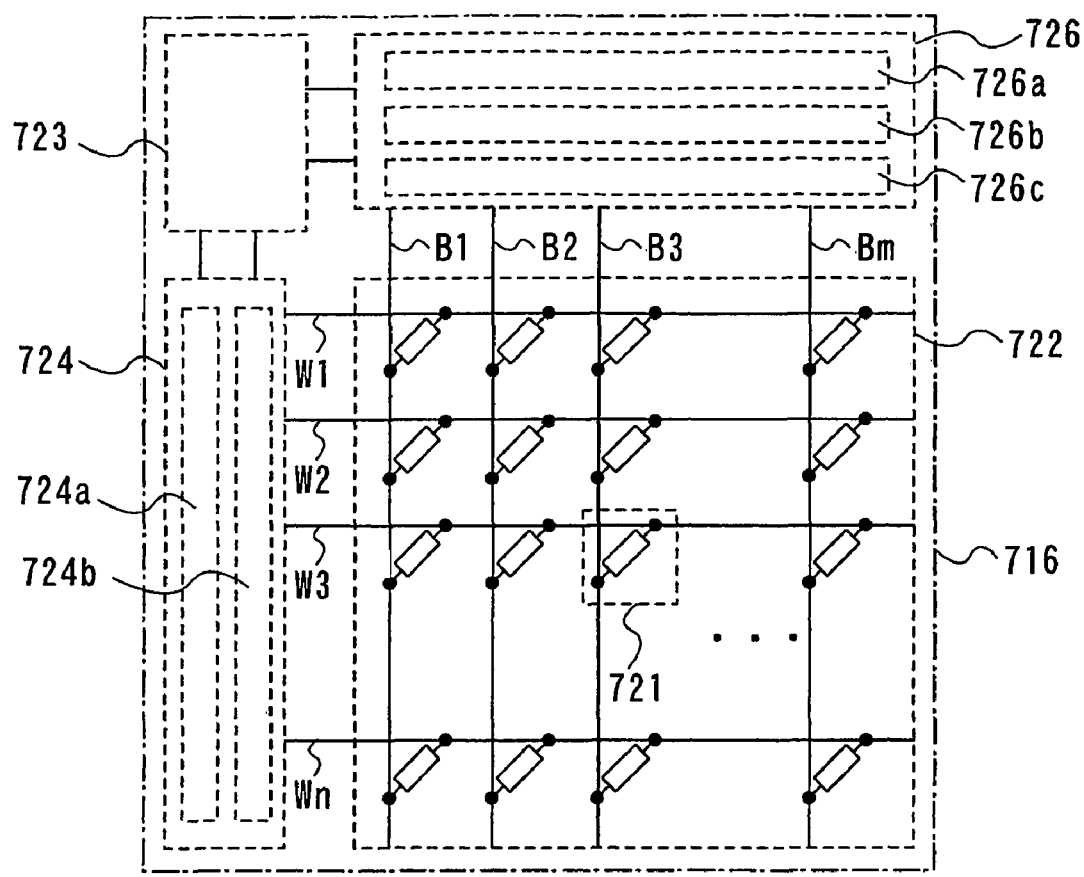
FIG. 3 is a diagram explaining a memory device of the present invention.

FIG. 3 shows an example of a structure of a memory device according to the present invention. A memory device 716 includes a memory cell array 722 provided with memory cells 721 arranged in matrix; a bit line driving circuit 726 having a column decoder 726a, a reading circuit 726b, and a selector 726c; a word line driving circuit 724 having a low decoder 724a and a level shifter 724b; and an interface 723 having a writing circuit and communicating with the outside. It is to be noted that the structure of the memory device 716 shown here is only one example. The memory device 716 may include a circuit such as a sense amplifier, an output circuit, and a buffer, and the writing circuit may be provided in the bit line driving circuit.

The memory cell 721 includes a first conductive layer forming a word line Wy ($1 \leq y \leq n$), a second conductive layer forming a bit line Bx ($1 \leq x \leq m$), and an insulting layer. The insulating layer has a single layer structure or a stacked layers structure and provided between the first conductive layer and the second conductive layer.

Figure 2A:
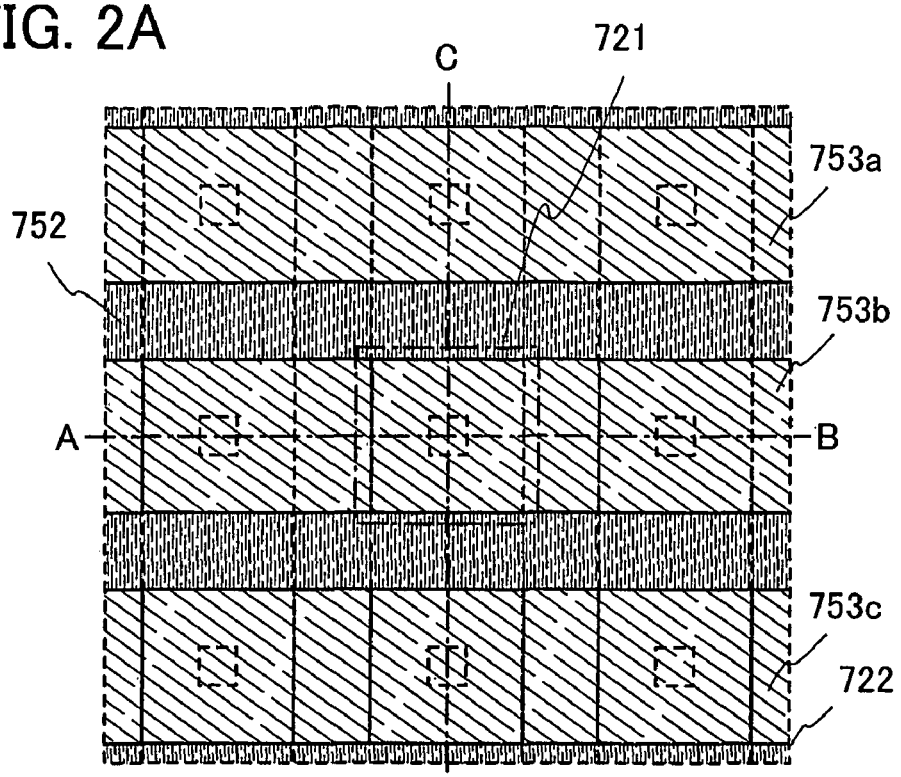
FIGS. 2A to 2C are diagrams explaining a memory device of the present invention.
Figure 2B:
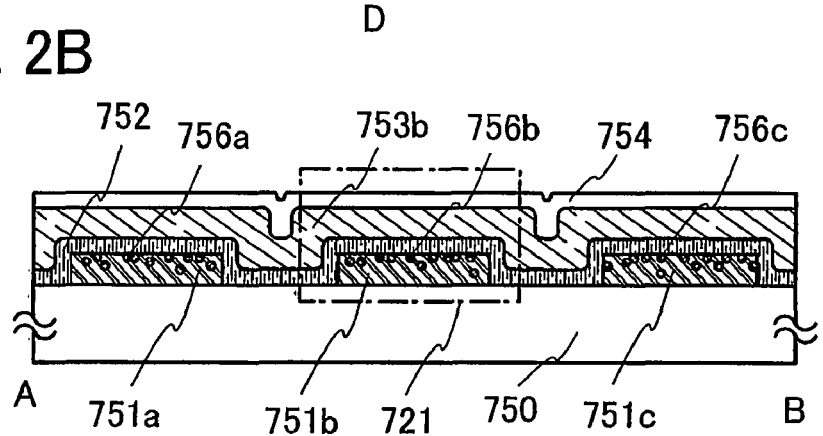
Figure 2C:
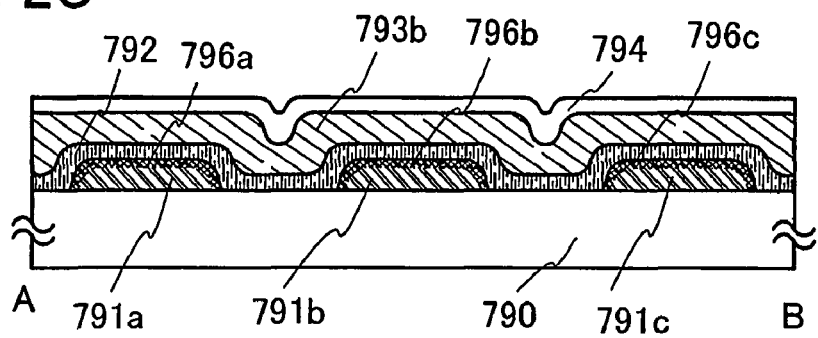

FIG. 2A shows a top view of the memory cell array 722, FIGS. 2B and 2C show cross-sectional views taken along a line A-B in FIG. 2A. In FIG. 2A, an insulating layer 754 is not shown, however, it is provided as shown in FIG. 2B.

The memory cell array 722 includes a first conductive layer 751a, which includes a plurality of insulators 756a, a first conductive layer 751b which includes a plurality of insulators 756b, and a first conductive layer 751c which includes a plurality of insulators 756C, which extend in a first direction. The memory cell array 722 also includes an organic compound layer 752 that is provided to cover the first conductive layers 751a, 751b, and 751c, and second conductive layers 753a, 753b, and 753c which extend in a second direction perpendicular to the first direction (see FIG. 2A). The plurality of insulators 756a are provided at the interface of the first conductive layer 751a and the organic compound layer 752, the plurality of insulators 756b are provided at the interface of the first conductive layer 751b and the organic compound layer 752, and the plurality of insulators 756c are provided at the interface of the first conductive layer 751c and the organic compound layer 752. Furthermore, an insulating layer 754 functioning as a protective film is provided to cover the second conductive layers 753a, 753b, and 753c (see FIG. 2B). When influence of an electric field in the lateral direction between each adjacent memory cell is concerned, the organic compound layer 752 that is provided in each memory cell may be isolated.

FIG. 2C is a modification example of FIG. 2B, and has over a substrate 790 a conductive layer 791a having an insulator mixture region 796a, a first conductive layer 791b having an insulator mixture region 796b, a first conductive layer 791c having an insulator mixture region 796c, an organic compound layer 792, a second conductive layer 793b, and an insulating layer 794 which is a protective layer. The first conductive layer may have a tapered shape or a shape in which a radius of curvature is varied continuously like the first conductive layer 791a having the insulator mixture region 796a, the first conductive layer 791b having the insulator mixture region 796b, and the first conductive layer 791c having the insulator mixture region 796c in FIG. 2C. The shape of the first conductive layer 791a having the insulator mixture region 796a, the first conductive layer 791b having the insulator mixture region 796b, and the first conductive layer 791c having the insulator mixture region 796c can be formed by a droplet discharging method or the like. A curved surface having such a curvature provides favorable coverage of stacked insulating layers or conductive layers. In addition, the first conductive layers shown in FIG. 2C, which constitute a memory element, show an example where after forming the first conductive layers an insulator mixture region is formed by modifying the surface thereof.

The mixture state of the plurality of insulators in the organic compound layer, which is shown in this Embodiment Mode, is an example, and the concentration of the insulators and the like can be controlled, as shown in FIG. 17, depending on the property and size of materials used as a plurality of insulators, a material used as a conductive layer, and a forming method. In addition, as shown in FIGS. 1B and 1C and FIGS. 17B and 17C, a second conductive layer (a second conductive layer having an insulator mixture region) including a plurality of insulators may be formed by mixing the insulators into the second conductive layer, or a first conductive layer (a first conductive layer having an insulator mixture region) including a plurality of insulators and a second conductive layer (a second conductive layer having an insulator mixture region) including a plurality of insulators may be formed by mixing a plurality of insulators into both the first conductive layer and the second conductive layer.

Figure 8A:
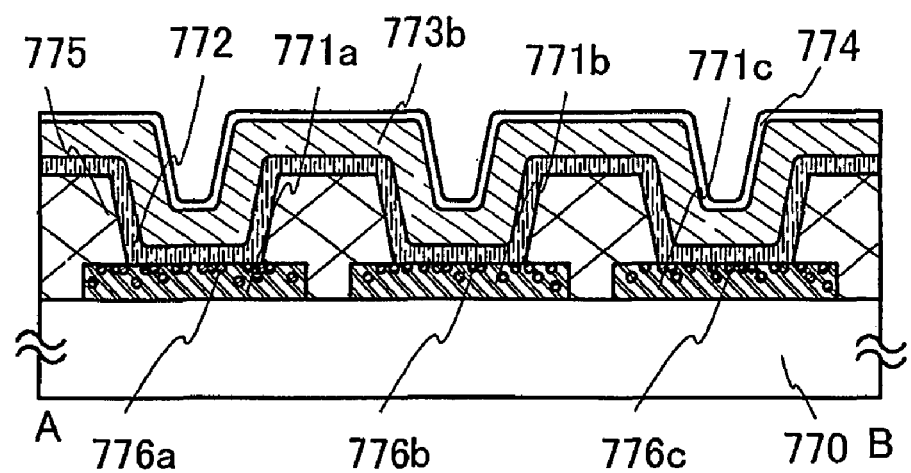
FIGS. 8A and 8B are diagrams explaining a memory device of the present invention.
Figure 8B:
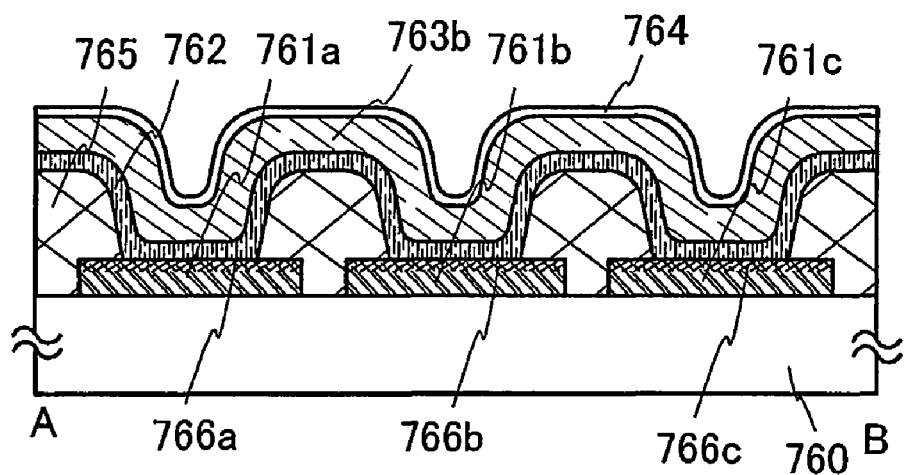

In addition, a partition wall (an insulating layer) may be formed to cover an end of the first conductive layer. The partition wall (insulating layer) serves as a wall that separates the memory elements from each other. FIGS. 8A and 8B show a structure in which ends of first conductive layers are covered with a partition wall (insulating layer). FIGS. 8A and 8B are cross-sectional views taken along a line A-B in FIG. 2A similarly to FIGS. 2B and 2C.

In the example of a memory element shown in FIG. 8A, a partition wall (insulating layer) 775 is formed in a tapered shape to cover ends of first conductive layers 771a, 771b, and 771c including a plurality of insulators 776a, 776b, and 776c respectively. The partition wall (insulating layer) 775 is formed on the first conductive layer 771a including the plurality of insulators 776a, the first conductive layer 771b including the plurality of insulators 776b, and the first conductive layer 771c including the plurality of insulators 776c which are provided on a substrate 770, and an organic compound layer 772, a second conductive layer 773b, and an insulating layer 774 are formed.

In FIG. 8B showing an example of a memory element, a partition wall (insulating layer) 765 has a curvature, and the curvature varies continuously. A first conductive layer 761a having an insulator mixture region 766a formed, a first conductive layer 761b having an insulator mixture region 766b, a first conductive layer 761c having an insulator mixture region 766c, an organic conductive layer 762, a second conductive layer 763b, and an insulating layer 764 are formed over a substrate 760. The insulator mixture regions 766a, 766b, and 766c can be formed by modifying the surface of a conductive layer, a co-evaporation method with an insulator and a conductive material, or a sputtering method.

For the substrate 750, the substrate 760, the substrate 770, and the substrate 780 in the structure of the above mentioned memory cells, a quartz substrate, a silicon substrate, a metal substrate, a stainless substrate, or the like can be used as well as a glass substrate or a flexible substrate. The flexible substrate is a substrate that can be bent, such as a plastic substrate formed of polycarbonate, polyarylate, polyether sulfone, or the like. In addition, a multilayer film (made of polypropylene, polyester, vinyl, polyvinyl fluoride, polyvinyl chloride or the like), paper of a fibrous material, a base material film (polyester, polyamide, an inorganic vapor deposition film, paper, or the like), or the like can be used. Alternatively, the memory cell array 722 can be provided over a field effect transistor (FET) formed over a semiconductor substrate such as a Si substrate, or over a thin film transistor (TFT) formed over a substrate such as a glass substrate.

The first conductive layers 751a to 751c, 761a to 761c, 771a to 771c, and 791a to 791c, and the second conductive layers 753a to 753c, 763a to 763c, 773a to 773c, and 793a to 793c shown in this embodiment mode may be formed using any one of the materials and the forming methods of the first conductive layer 50 and the second conductive layer 53 shown in Embodiment Mode 1.

Further, the insulators 756a to 756c and 776a to 776c, the insulators in the insulator mixture regions 766a to 766c and 796a to 796c, and the organic compound layers 752, 762, 772, and 792 can be provided using the same material and the same forming method as the insulators and the organic compound layer shown in the above Embodiment Mode 1.

An element having a rectifying property may be provided at the opposite side of the organic compound layers 752, 762, 772, and 792 through the first conductive layers 751a to 751c, 761a to 761c, 771a to 771c, and 791a to 791c. For example a diode including a third conductive layer and a semiconductor layer may be provided to be in contact with the first conductive layers 751a to 751c, 761a to 761c, 771a to 771c, and 791a to 791c. Note that an element having a rectifying property may be provided at the opposite side of the organic compound layer through the second conductive layer. Further, an element having a rectifying property may be provided between the first conductive layers 751a to 751c, 761a to 761c, 771a to 771c, and 791a to 791c, and the organic compound layers 752, 762, 772, and 792. Further, the element having a rectifying property may be provided between the organic compound layers 752, 762, 772, and 792, and the second conductive layers 753a to 753c, 763a to 763c, 773a to 773c, and 793a to 793c. In the case of providing the element having a rectifying property, it is necessary to have a structure where insulators are mixed into at least one of a pair of conductive layers which are in contact with an organic compound layer so that the plurality of insulators are in contact with the organic compound layer.

As the partition wall (insulating layer) 765, and the partition wall (insulating wall) 775, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant polymer material such as polyimide, aromatic polyamide, or polybenzimidazole; or a siloxane resin may be used. Alternatively, a resin material such as a vinyl resin such as polyvinyl alcohol and polyvinylbutyral, an epoxy resin, a phenol resin, a novolac resin, an acrylic resin, a melamine resin, or a urethane resin is used. Also, an organic material such as benzocyclobutene, parylene, allylene ether fluoride, or polyimide or a composition material including a water-soluble homopolymer and a water-soluble copolymer may be used.

As a manufacturing method, a vapor phase growth method such as a plasma CVD method or a thermal CVD method, or a sputtering method can be used. Further, a droplet discharging method, a dispenser method, or a printing method (a method for forming a pattern, such as screen printing or offset printing) can also be used. A TOF film and SOG film obtained by a coating method can also be used.

After forming a conductive layer, an insulating layer or the like by discharging a composition by a droplet discharging method, a surface thereof may be planarized by pressure to improve planarity. As a method for pressing, a roller-like object may be scanned on the surface so as to reduce the unevenness, or the surface may be perpendicularly pressed with a flat plate-like object. A heating step may also be performed at the same time as pressing. Also, the surface may be softened or dissolved by a solvent or the like, and the unevenness of the surface may be removed with an air knife. In addition, polishing may be performed by a CMP method. This step can be employed in planarizing a surface when unevenness is generated by a droplet discharging method.

By the present invention, characteristics of a memory element such as writing voltage are not varied. Consequently, writing can be performed normally in each element. In addition, when a plurality of insulators are mixed into a conductive layer, physical impact can be avoided as compared to the case in which an insulating layer is formed on the conductive layer. Therefore, film separation and defective shape are hard to occur. Because an insulator can be provided in a stable state at the interface of a conductive layer and an insulating layer, a defective element where conductive layers are short-circuited in an initial state can not be made, and high reliability memory element and semiconductor device can be provided at high yield.

In addition, since insulators are mixed into a conductive layer or insulators are combined with a conductive layer, the film is less subjective to damage. Therefore, the flexibility of a process which is chosen is extended. Therefore, a memory element and a memory device can be manufactured more efficiently, and reduction of production cost and enhancement of productivity can be achieved.

Embodiment Mode 3

In this embodiment mode, a memory device having a different structure from that shown in Embodiment Mode 2, will be described. Specifically, a structure of an active matrix memory device is described.

Figure 5:
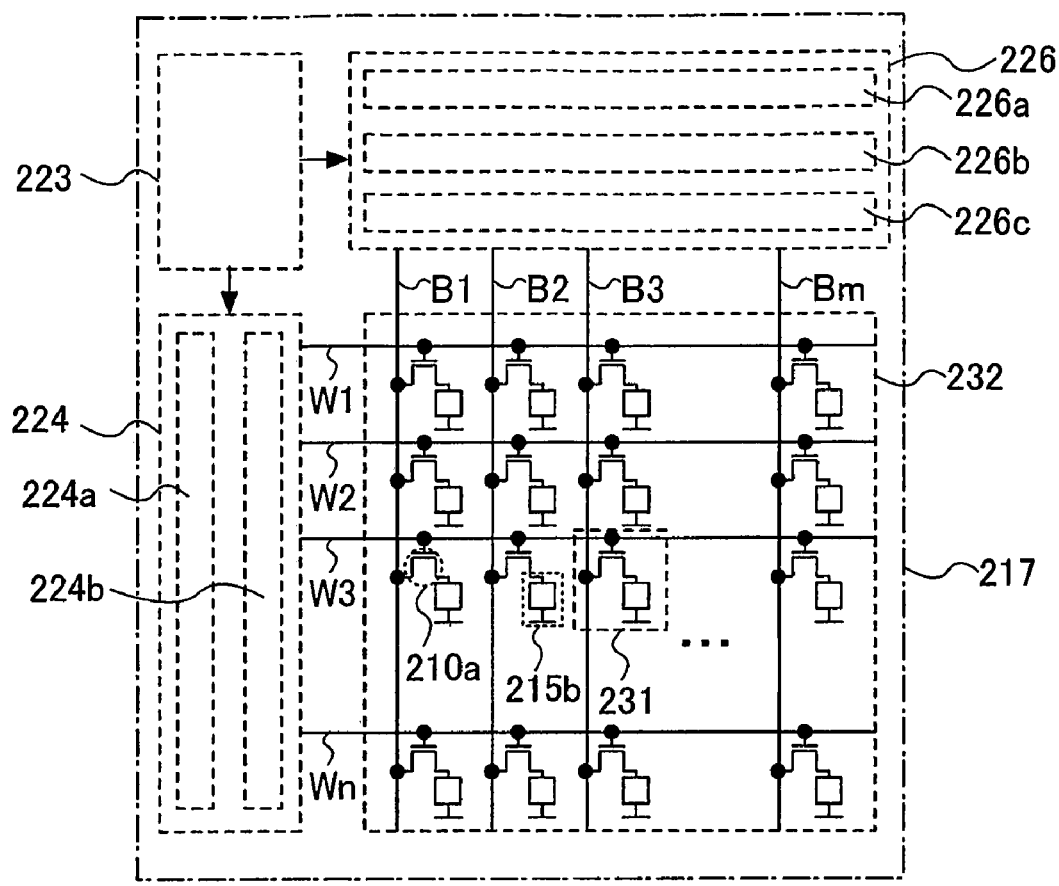
FIG. 5 is a diagram explaining a memory device of the present invention.

FIG. 5 shows an example of a structure of a memory device that is shown in this embodiment mode. A memory device 217 includes a memory cell array 232 provided with memory cells 231 arranged in matrix, a bit line driving circuit 226 having a column decoder 226a, a reading circuit 226b, and a selector 226c, a word line driving circuit 224 having a row decoder 224a and a level shifter 224b, and an interface 223 having a writing circuit and the like and communicating with the outside. It is to be noted that the structure of the memory device 217 shown here is only one example. The memory device 217 may include other circuits such as a sense amplifier, an output circuit, and a buffer. The writing circuit may be provided in the bit line driving circuit.

The memory cell 231 includes a first wire forming a word line Wy (1=y=n), a second wire forming a bit line Bx (1=x=m), a transistor 210a, a memory element 215b, and the memory cell 231. The memory element 215b has a structure in which an insulating layer is interposed between a pair of conductive layers.

Figure 4A:
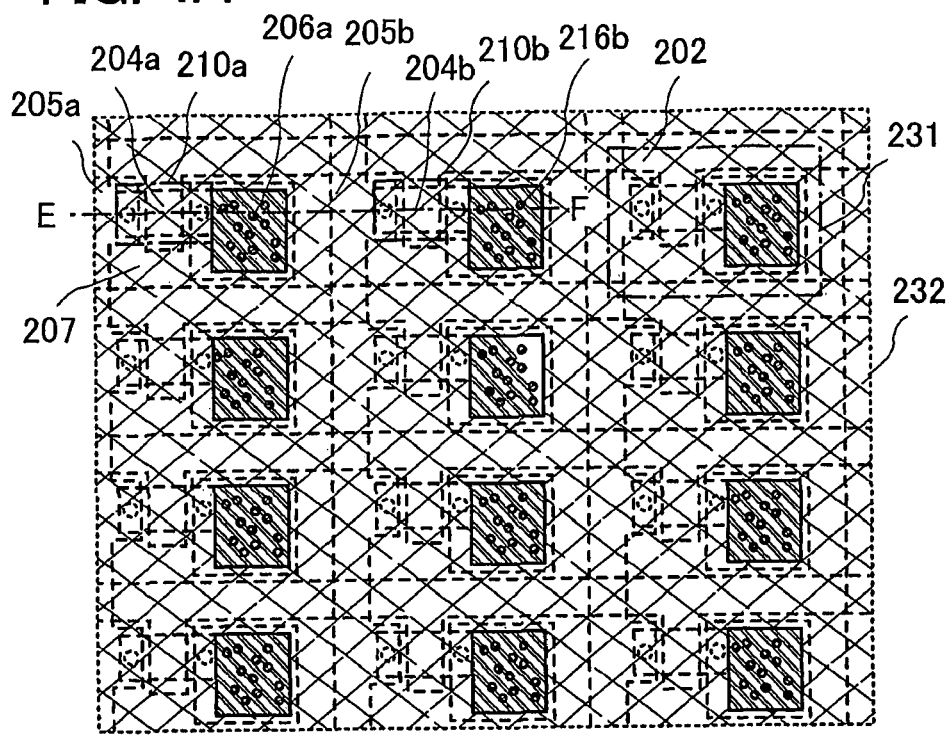
FIGS. 4A and 4B are diagrams explaining a memory device of the present invention.
Figure 4B:
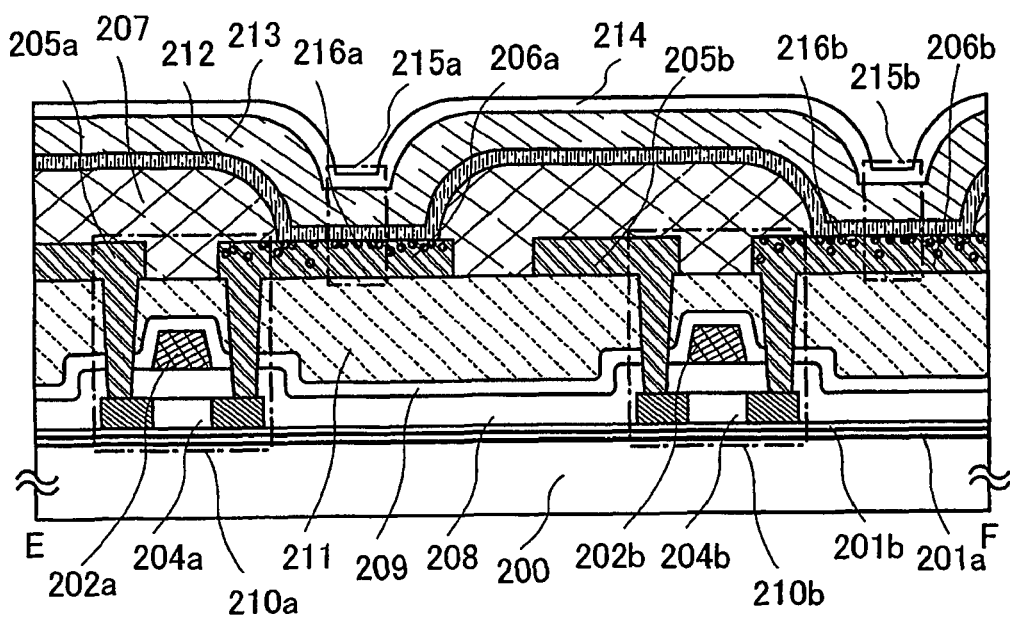

FIG. 4A shows a top view of the memory cell array 232, and FIG. 4B shows a cross-sectional view taken along a line E-F in FIG. 4A. In FIG. 4A, an organic compound layer 212 and an insulating layer 214 are not shown, however, the second conductive layer 212 and the insulating layer 214 are provided as shown in FIG. 4B.

In the memory cell array 232, a first wire 205a and a first wire 205b extending in a first direction, and a second wire 202 extending in a second direction that is perpendicular to the first direction are provided in matrix. Each of the first wires is connected to source electrodes or drain electrodes of the transistor 210a and the transistor 210b. The second wire is connected to gate electrodes of the transistor 210a and the transistor 210b. Further, each of a first conductive layer 206a and a first conductive layer 206b which include a plurality of insulators 216a and a plurality of insulators 216b respectively is connected to the source electrodes or the drain electrodes of the transistors 210a and 210b, which are not connected to the first wires. Then, an insulating layer 212 and a second conductive layer 213 are stacked over the first conductive layer 206a and the first conductive layer 206b to provide a memory element 215a and a memory element 215b. A partition wall (insulating layer) 207 is provided between adjacent memory cells 231, and the organic compound layer 212 and the second conductive layer 213 are stacked over the first conductive layer 206a including the plurality of insulators 216a, the first conductive layer 206b including the plurality of insulators 216b, and the partition wall (insulating layer) 207. In addition, the insulating layer 214 is provided as a protective layer over the second conductive layer 213. As the transistors 210a and 210b, thin film transistors are employed in FIGS. 4A and 4B (see FIG. 4B).

The memory device in FIG. 4B is provided over a substrate 200 and has insulating layers 201a, 201b, 208, 209, and 211, a semiconductor layer 204a, a gate electrode layer 202a, a wire 205a functioning as a source electrode layer or a drain electrode layer which constitute the transistor 210a, and a semiconductor layer 204b, and a gate electrode layer 202b which structures the transistor 210b. The organic compound layer 212 and the second conductive layer 213 are formed over the first conductive layer 206a including the insulators 216a, the first conductive layer 206b including the insulators 216b, and the partition wall (insulating layer) 207.

A mixture state of insulators in the first conductive layers 206a and 206b, which is shown in this embodiment mode, is an example, and the concentration of insulators and the like can be controlled, as shown in FIG. 17, depending on the property and size of materials used as insulators, a material used as a conductive layer, and a forming method. In addition, as shown in FIGS. 1B and 1C and FIGS. 17B and 17C, a second conductive layer (a second conductive layer having an insulator mixture region) including insulators may be formed by mixing the insulators into the second conductive layer, and a first conductive layer (a first conductive layer having an insulator mixture region) including insulators and a second conductive layer (a second conductive layer having an insulator mixture region) including insulators may be formed by mixing insulators into both the first conductive layer and the second conductive layer. In the memory elements 215a and 215b of FIGS. 4A and 4B, a conductive film is processed to a desired shape, and the first conductive layers 205a, 205b, 206a, and 206b are formed, then the insulators 216a and 216b are selectively mixed into the first conductive layers 206a and 206b. Mixing of insulators can be performed before processing a conductive film into a desired shape; in this case, the first wires 205a and 205b are also mixed with the insulators.

In this embodiment mode, the organic compound layer 212 forming a memory element that is included in a memory device is formed over the first conductive layer containing insulators. When voltage is applied between the first conductive layer and the second conductive layer, current flows through the organic compound layer 212 and heat is generated. Due to the effect of such heat and a high electric field, the film thickness of the organic compound layer becomes uneven, and the organic compound layer is transformed so that the first conductive layer is in contact with the second conductive layer. Accordingly, the first conductive layer and the second conductive layer are short-circuited. Accordingly, the conductivity of the memory element changes before and after applying voltage.

The insulators 216a and 216b existing at the interface of the organic compound layer 212 and the first conductive layers 206a and 206b, allow tunnel injection of carriers from the first conductive layer 206b to the organic compound layer 212. Therefore, the characteristics of a memory element such as a writing voltage are not varied to be stabilized, and writing can be performed normally in each element. In addition, since insulators are mixed into a conductive layer, physical impact can be avoided as compared to the case in which an insulating layer is formed on the conductive layer. Therefore film separation and defective shape are hard to occur. Therefore, because insulators can be provided in a stable state at the interface of a conductive layer and an insulating layer, an element where conductive layers are short-circuited in an initial state can be prevented from being manufactured. As a result, a memory device and a semiconductor device with high reliability can be provided at low cost with high yield.

In addition, since insulators are mixed into a conductive layer or insulators are combined with a conductive layer, the film is less subjective to damage. Therefore the flexibility of a process which is chosen is extended. Therefore, a memory element and a memory device can be manufactured more efficiently, and reduction of production cost and enhancement of productivity can be achieved.

Figure 6:
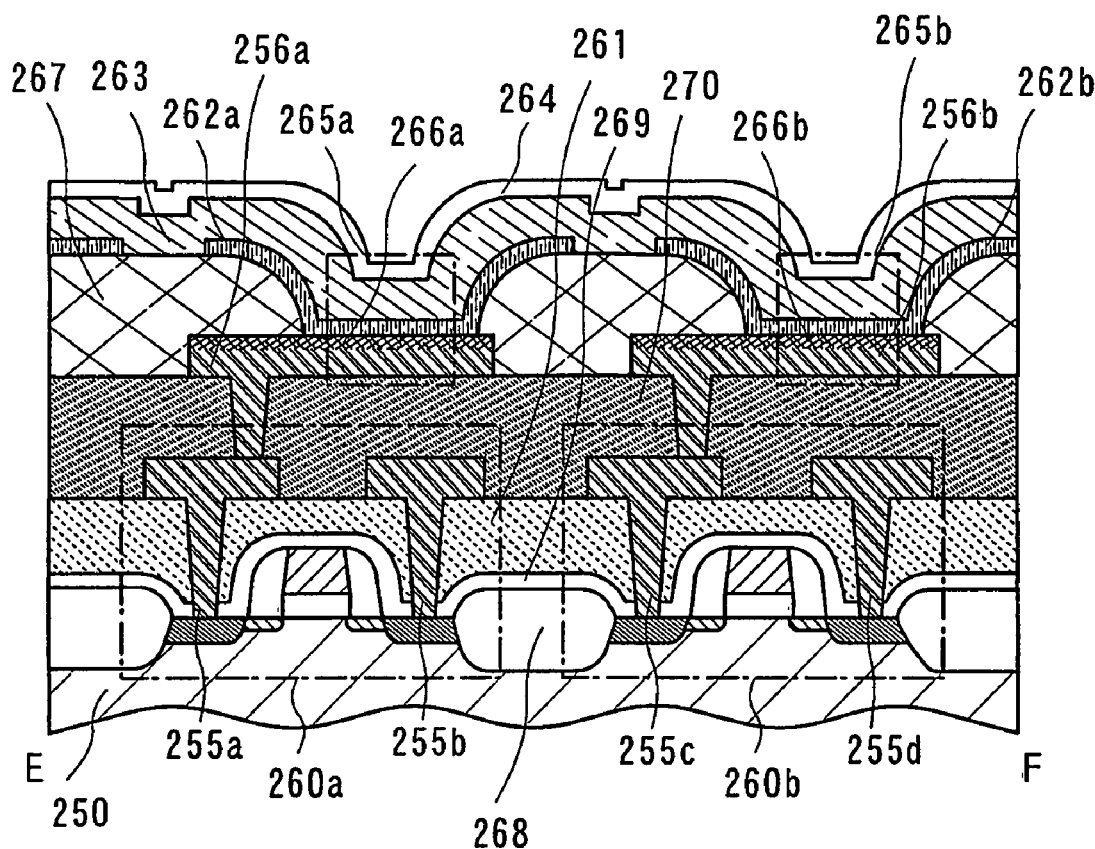
FIG. 6 is a diagram explaining a memory device of the present invention.

As shown in FIG. 6, a memory element 265a and a memory element 265b may be connected to a field effect transistor 260a and a field effect transistor 260b provided over a single crystal semiconductor substrate 250. Here, an insulating layer 270 is provided to cover source or drain electrode layers 255a to 255d of the field effect transistor 260a and the field effect transistor 260b. Over the insulating layer 270, a first conductive layer 256a including an insulator mixture region 266a, a first conductive layer 256b including an insulator mixture region 266b, a partition wall (insulating layer) 267, an organic compound layer 262a, an organic compound layer 262b, and a second conductive layer 263 are provided to form the memory element 265a and a memory element 265b. More specifically, the organic compound layers 262a and 262b are formed over the first conductive layer 256a including the insulator mixture region 266a, the first conductive layer 256b including the insulator mixture region 266b, and the partition wall 267, and the second conductive layer 263 is formed over the organic compound layers 262a and 262b. As the organic compound layers 262a and 262b, an organic compound layer may be selectively provided only in an individual memory cell using a mask or the like. In addition, the memory device shown in FIG. 6 includes an element isolation region 268, an insulating layer 269, an insulating layer 261, and an insulating layer 264.

The mixture state of the plurality of insulators in the first conductive layers 256a and 256b shown in FIG. 6 is an example, and the concentration of the insulators and the like can be controlled, as shown in FIG. 17, depending on the property and size of materials used as a plurality of insulators, a material used as a conductive layer, and a forming method. In addition, as shown in FIGS. 1B and 1C and FIGS. 17B and 17C, a second conductive layer (a second conductive layer having an insulator mixture region) including an insulator may be formed by mixing the insulators into the second conductive layer, or a first conductive layer (a first conductive layer having an insulator mixture region) including an insulator and a second conductive layer (a second conductive layer having an insulator mixture region) including an insulator may be formed by mixing an insulator into both the first conductive layer and the second conductive layer.

The first conductive layers 256a and 256b constituting the memory elements 265a and 265b show examples where conductive layers are formed using Al or the like, then the insulator mixture regions 266a and 266b are provided by modifying the surface by oxidation or the like. In the case of forming an insulator mixture region on the surface by oxidation treatment, metal (for example, Al) or semiconductor (for example, Si), which is easily oxidized, is preferably used as a conductive layer. In addition, after forming a conductive layer, Si or the like is added to the conductive layer by an ion doping method, then an insulator mixture region can be selectively formed in the conductive layer by oxidation using thermal processing.

In the case of the memory device shown in FIG. 6, the organic compound layers 262a and 262b constituting a memory element in the memory device are formed over the first conductive layer 256a having the insulator mixture region 266a and the first conductive layer 256b having the insulator mixture region 266b. When voltage is applied between the first conductive layer and the second conductive layer, current flows through the organic compound layers 262a and 262b, and heat is generated. Due to the effect of such heat and a high electric field, the film thickness of the organic compound layer becomes uneven, and the organic compound layer is transformed so that the first conductive layer is in contact with the second conductive layer. Accordingly, the first conductive layer and the second conductive layer are short-circuited. Accordingly, the conductivity of the memory element changes before and after applying voltage.

A plurality of insulators in the insulator mixture region 266a and a plurality of insulators in the insulator mixture region 266b, which exist at the interface of the organic compound layer 262a and the first conductive layer, and between the organic compound layer 262b and the first conductive layer respectively allow tunnel injection of carriers to the organic compound layers 262a and 262b from the first conductive layer. Consequently, characteristics of a memory element such as writing voltage are not varied to be stabilized. Consequently, writing can be performed normally in each element. In addition, when an insulator is mixed into a conductive layer, physical impact can be avoided as compared to the case in which an insulating layer is formed on the conductive layer. Therefore film separation and defective shape are hard to occur. Therefore, because a plurality of insulator can be provided in a stable state at the interface of a conductive layer and an insulating layer, a defective element where conductive layers are short-circuited in an initial state can be prevented from being manufactured, and high reliability memory element and semiconductor devices can be provided at high yield.

In addition, due to a state that insulator is mixed in a conductive layer or a form that complexing insulator and a conductive layer, a film is tolerant of damage. Therefore flexibility of a process which is chosen is extended. Therefore, a process making a memory element, memory can be set more efficiently, reduction of production cost, enhancement of productivity can be achieved.

In addition, the first conductive layer can be arranged freely by providing the insulating layer 270 to form a memory element. That is, in the structure of FIG. 4B, the memory elements 215a and 215b are required to be provided in the regions where the source or drain electrode layers of the transistors 210a and 210b are not provided; however, for example, it is possible to form the memory element 215a and the memory element 215b above the transistors 210a and 210b by employing the above structure. As a result, the memory device can be more highly integrated.

The transistor 210a and the transistor 210b may have any structure as long as the transistors 210a and 210b can serve as a switching element. As a semiconductor layer, various types of semiconductors such as an amorphous semiconductor, a crystalline semiconductor, a polycrystalline semiconductor, and a microcrystalline semiconductor can be used, and an organic transistor may be formed by using an organic compound. FIG. 4A shows an example of providing a planar thin film transistor over an insulating substrate; however, a transistor can also be formed to have a staggered structure, an inverted staggered structure, or the like.

Figure 7:
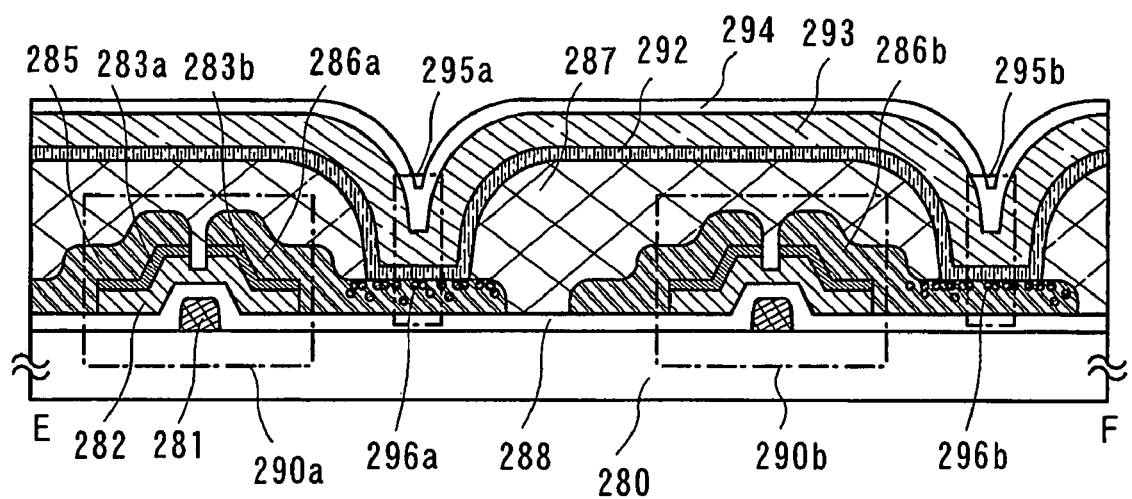
FIG. 7 is a diagram explaining a memory device of the present invention.

FIG. 7 shows an example of using a thin film transistor having an inverted staggered structure. A transistor 290a and a transistor 290b, which are thin film transistors each having an inverted staggered structure, are provided over a substrate 280. The transistor 290a has an insulating layer 288, a gate electrode layer 281, an amorphous semiconductor layer 282, semiconductor layers of one conductivity type 283a and 283b, and a source electrode layer or a drain electrode layer 285; and the other of the source and drain electrode layers is also used as a first conductive layer 286a which constitutes a memory element. A partition wall (insulating layer) 287 is stacked to cover ends of the first conductive layers 286a and 286b. An organic compound layer 292, a second conductive layer 293, and an insulating layer 294 that is a protective layer are formed over the first conductive layer 286a including a plurality of insulators 296a, the first conductive layer 286b including a plurality of insulators 296b, and the partition wall (insulating layer) 287 to form memory elements 295a and 295b. A plurality of insulators 296a and 296b in the conductive layers 286a and 286b, are selectively added to the region of the memory elements 295a and 295b which is overlapped with the second conductive layer 293. As described above, a plurality of insulators may be selectively mixed into the first conductive layers. In the case of a memory element of FIG. 7 in this embodiment mode, the plurality of the insulators 296a and 296b are selectively added to the first conductive layers 286a and 286b by an ion doping method, an ion implantation method, or the like.

The mixture state of the insulators in the first conductive layers 256a and 256b shown in FIG. 7 is an example, and the concentration of the insulators and the like can be controlled, as shown in FIG. 17, by the property and size of materials used as a plurality of insulators, a material used as a conductive layer, and a forming method. In addition, as shown in FIGS. 1B and 1C and FIGS. 17B and 17C, a second conductive layer (a second conductive layer having an insulator mixture region) including an insulator may be formed by mixing the insulators into the second conductive layer, or a first conductive layer (a first conductive layer having an insulator mixture region) including an insulator and a second conductive layer (a second conductive layer having an insulator mixture region) including an insulator may be formed by mixing an insulator into both the first conductive layer and the second conductive layer.

In the memory device of FIG. 7 according to this embodiment mode, the organic compound layer 292 forming the memory element that is included in the memory device is formed over the first conductive layers 286a and 286b containing the insulators 296a and 296b. When voltage is applied between the first conductive layer and the second conductive layer, current flows through the organic compound layer 292 and heat is generated. By such effect of heat and a high electric field, when the temperature of the organic compound layer rises to the glass-transition temperature, a material forming the organic compound layer 292 becomes a composition having fluidity. The composition having fluidity flows without maintaining the shape of a solid state. Therefore, the film thickness of the organic compound layer becomes uneven, and the organic compound layer is transformed so that the first conductive layer is in contact with the second conductive layer. Accordingly, the first conductive layer and the second conductive layer are short-circuited. Accordingly, the conductivity of the memory element changes before and after applying voltage.

The insulators 296a and 296b existing at the interface of the organic compound layer 292 and the first conductive layer allow tunnel injection of carriers from the first conductive layer to the organic compound layer 292. Consequently, characteristics of a memory element such as a writing voltage are not varied to be stabilized. Consequently, writing can be performed normally in each element. In addition, when insulators are mixed into a conductive layer, physical impact can be avoided as compared to the case in which an insulating layer is formed on the conductive layer. Therefore, film separation and defective shape are hard to occur. Because insulators can be provided in a stable state at the interface of a conductive layer and an insulating layer, a defective element where conductive layers are short-circuited in an initial state can be prevented from being manufactured, and high reliability memory element and semiconductor device can be provided at high yield.

In addition, due to a state that insulator is mixed in a conductive layer or a form that complexing insulator and a conductive layer, a film is tolerant of damage. Therefore flexibility of a process which is chosen is extended. Therefore, a process making a memory element, memory can be set more efficiently, reduction of production cost, enhancement of productivity can be achieved.

In the memory device shown in FIG. 7, a gate electrode 281, the source or drain electrode layer 285, the first conductive layers 286a and 286b, and the partition wall (insulating layer) 287 are formed by a droplet discharging method. The droplet discharging method is a method in which a composition containing a component forming material, which is fluid, is discharged (jetted) as a droplet to form a desired pattern. A droplet containing a component forming material is discharged on a formation region of the component and solidified by baking, drying, and the like to form a component having a desired pattern.

Figure 15:
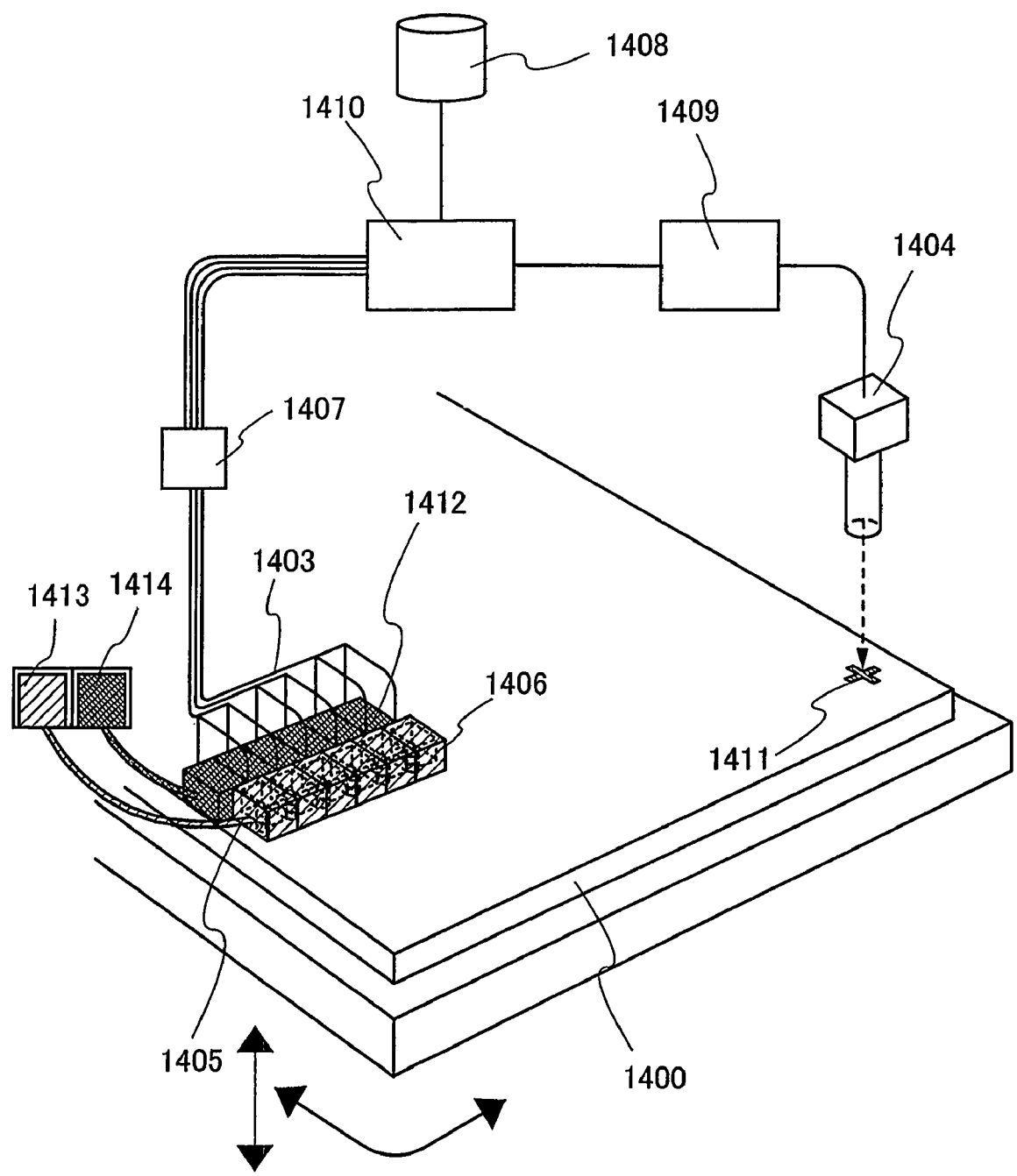
FIG. 15 is a diagram explaining a structure of a droplet discharge apparatus which can be applied to the present invention.

FIG. 15 shows one mode of a droplet discharge apparatus used for the droplet discharging method. Each of heads 1405 and 1412 of a droplet discharge means 1403 is connected to a control means 1407, and this control means 1407 is controlled by a computer 1410 so that a preprogrammed pattern can be drawn. The drawing timing may be determined, for example, based on a marker 1411 that is formed over a substrate 1400. Alternatively, a reference point may be fixed based on an edge of the substrate 1400. The reference point is detected by an imaging means 1404, and changed into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

The head 1405 has an inside structure that has a space filled with a liquid material as shown by dotted lines 1406 and a nozzle that is a discharge opening. Although it is not shown, an inside structure of the head 1412 is similar to that of the head 1405. When the nozzle sizes of the heads 1405 and 1412 are different from each other, different materials with different widths can be discharged simultaneously. A conductive material, an organic material, an inorganic material, and the like can also be respectively discharged from one head to draw a pattern. In the case of drawing in a wide area such as an interlayer film, one material can be simultaneously discharged from a plurality of nozzles to improve throughput, and thus, drawing can be performed. When a large-sized substrate is used, the heads 1405 and 1412 can freely scan over the substrate in directions indicated by arrows, and a region to be drawn can be freely set. Thus, a plurality of the same patterns can be drawn over one substrate.

In the case of forming a conductive layer by a droplet discharging method, a conductive layer is formed as follows: a composition containing a particle shaped conductive material is discharged, and fused or welded and joined by baking to solidify the composition. A conductive layer (or an insulating layer) formed by discharging and baking the composition containing the conductive material as described above tends to show a polycrystalline state having many grain boundaries whereas a conductive layer (or an insulating layer) formed by sputtering tends to show a columnar structure.

Further, any structure may be used for a semiconductor layer included in the transistors. For example, an impurity region (including a source region, a drain region, and an LDD region) may be formed, and either a p-channel type or an n-channel type may be used. An insulating layer (sidewall) may be formed to be in contact with a side face of the gate electrode, or a silicide layer may be formed for either or both of source and drain regions and the gate electrode. As a material for the silicide layer, nickel, tungsten, molybdenum, cobalt, platinum, or the like can be used.

As a material and a forming method of the first conductive layers 206a, 206b, 256a, 256b, 286a, and 286b, and the second conductive layers 213, 263, and 293 shown in this embodiment mode, any one of the materials and the forming methods shown in the above Embodiment Mode 1 can be employed.

Further, the insulators 216a, 216b, 296a, and 296b, the insulators in the insulator mixture region 266a and 266b, and the organic compound layers 212, 262a, 262b, and 292 can be provided by using the same material and the forming method as the insulating layers and the organic compound layer shown in the above embodiment mode 1.

An element having a rectifying property may be provided at the opposite side of the organic compound layers 212, 262a, 262b, and 292 through the first conductive layers 206a, 206b, 256a, 256b, 286a, and 286b (FIG. 2C). For example, a diode including a third conductive layer and a semiconductor layer may be provided to be in contact with the first conductive layer 206a, 206b, 256a, 256b, 286a, and 286b. Note that an element having a rectifying property may be provided at the opposite side of the organic compound layer through the second conductive layer. In addition, a rectifying element may be provided between the first conductive layers 206a, 206b, 256a, 256b, 286a, and 286b, and the organic compound layers 212, 262a, 262b, and 292. The element having a rectifying property is a transistor whose gate and drain electrodes are connected to each other or a diode. For example, a PN junction diode provided by stacking an n-type semiconductor layer and a p-type semiconductor layer can be used. In this manner, since current flows only in one direction by providing the diode having a rectifying property, errors are reduced and reading margin is improved. In the case of providing a diode, not only a diode having a PN junction but also a diode having another structure such as a diode having a PIN junction or an avalanche diode may be provided. It is to be noted that the rectifying element may be provided between the organic compound layers 212, 262a, 262b, and 292, and the second conductive layers 213, 263, and 293. In the case of an element having said rectifying property, it is necessary to have a form that an insulator is mixed with at least one of a pair of conductive layers which is in contact with an organic compound layer in order that an insulator is in contact with the organic compound layer.

By the present invention, characteristics of a memory element such as a writing voltage are stabilized without voltage variations. Consequently, writing can be performed normally in each element. In addition, since a plurality of insulators are mixed into a conductive layer, physical impact can be avoided as compared to the case in which an insulating layer is formed on the conductive layer. Therefore film separation and defective shape are hard to occur. Therefore, because insulators can be provided in a stable state at the interface of a conductive layer and an insulating layer, a defective element where conductive layers are short-circuited in an initial state can be prevented from being manufactured. As a result, a memory device and a semiconductor device with high reliability can be provided at low cost with high yield.

In addition, since insulators are mixed into a conductive layer or insulators are combined with a conductive layer, the film is less subjective to damage. Therefore the flexibility of a process which is chosen is extended. Therefore, a memory element and a memory device can be manufactured more efficiently, and reduction of production cost and enhancement of productivity can be achieved.

Embodiment Mode 4

In this embodiment mode, an example of a semiconductor device having a memory device as shown in the above described embodiment modes will be described with reference to the drawings.

One feature of the semiconductor device shown in this embodiment mode is that data can be read out from and written in the semiconductor device without contact. Data transmitting types can be largely classified into three of an electromagnetic coupling type in which a pair of coils are placed to face each other and communication is performed by mutual induction, an electromagnetic induction type in which communication is performed by an induction field, and a radio wave type in which communication is performed by utilizing radio waves. Any type can be employed. An antenna that is used for transmitting data can be provided in two ways. One way is to provide the antenna over a substrate provided with a plurality of elements and a memory element, and the other way is to provide a terminal portion over a substrate provided with a plurality of elements and a memory element and to connect an antenna provided over another substrate to the terminal portion.

First, an example of a structure of a semiconductor device in the case of providing an antenna over a substrate provided with a plurality of elements and a memory element will be described with reference to FIG. 10.

Figure 10:
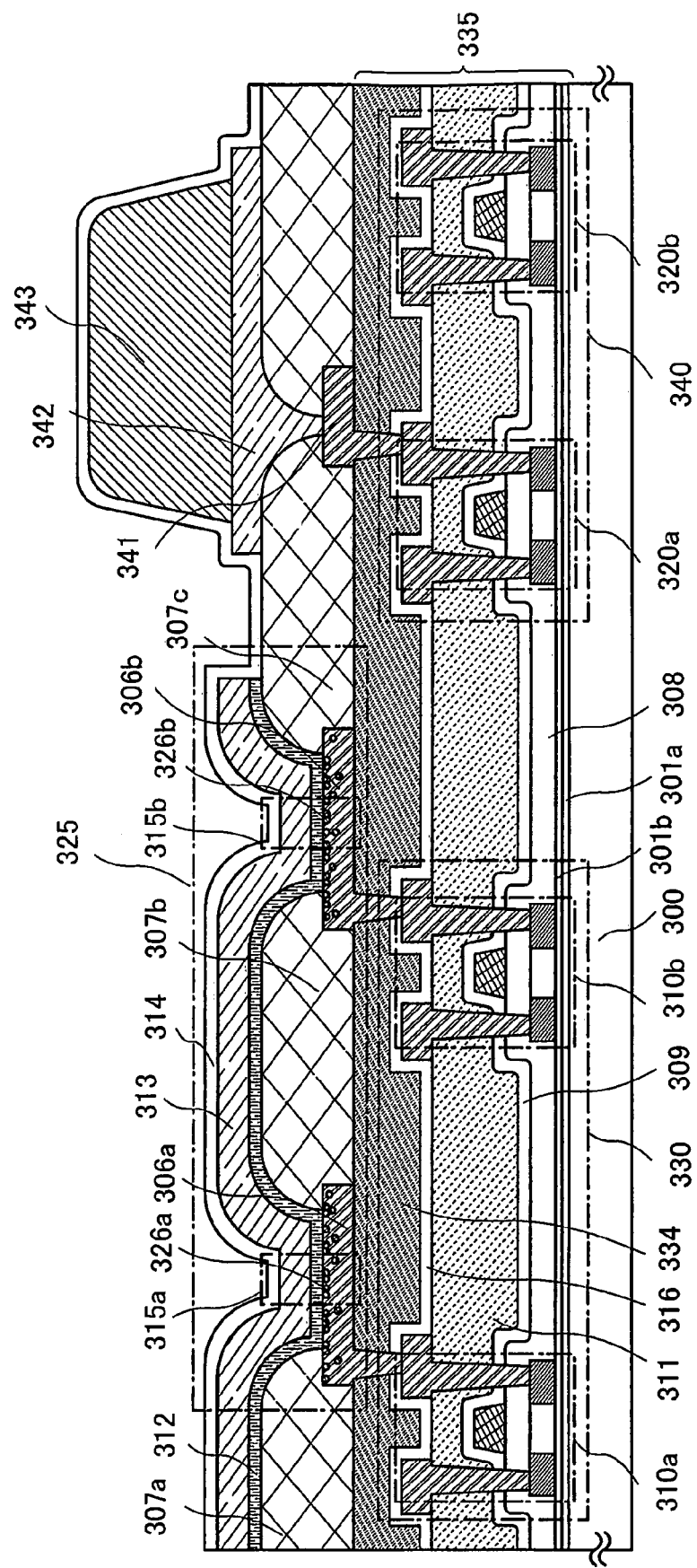
FIG. 10 is a diagram explaining a semiconductor device of the present invention.

FIG. 10 shows a semiconductor device which has a memory device that is structured as an active matrix type, in which an element forming layer 335 including a transistor portion 330 having transistors 310a and 310b; a transistor portion 340 having transistors 320a and 320b; and insulating layers 301a, 301b, 308, 311, 316, and 334, is provided over a substrate 300. Furthermore, a memory element portion 325, and a conductive layer 343 that functions as an antenna are provided over the element forming layer 335.

It is to be noted that, here, the case where the memory element portion 325 or the conductive layer 343 serving as an antenna is provided in the upper side of the element forming layer 335 is shown; however, the present invention is not to limited to this structure, and it is possible to provide the memory element portion 325 or the conductive layer 343 serving as an antenna in the lower side of the element forming layer 335 or in the same layer thereof.

The memory element portion 325 includes a memory element 315a and a memory element 315b. The memory element 315a is formed by stacking a partition wall (insulating layer) 307a, a partition wall (insulating layer) 307b, an organic compound layer 312, and a second conductive layer 313 over a first conductive layer 306a including plural insulators 326a. The memory element 315b is provided by stacking the partition wall (insulating layer) 307b, a partition wall (insulating layer) 307c, the organic compound layer 312, and the second conductive layer 313 over a first conductive layer 306b including plural 326b. Further, an insulating layer 314 serving as a protective film is formed to cover the second conductive layer 313. The first conductive layers 306a and 306b in which the plurality of memory elements 315a and 315b are respectively formed, are connected to a source electrode layer or a drain electrode layer of the transistors 310a and 310b. In other words, each memory element is connected to one transistor. The organic compound layer 312 is formed entirely to cover the first conductive layers 306a and 306b, and the partition walls (insulating layers) 307a, 307b, and 307c; however, the organic compound layer 312 may be formed selectively in each memory cell. Note that the memory elements 315a and 315b can be formed by using the materials or the manufacturing methods shown in the above embodiment modes.

The mixture state of the plurality of insulators in the first conductive layer 306a and 306b shown in FIG. 10 is an example, and the concentration of the insulators and the like can be controlled, as shown in FIG. 17, by the property and size of materials used as a plurality of insulators, a material used as a conductive layer, and a forming method. In addition, as shown in FIGS. 1B and 1C and FIGS. 17B and 17C, a second conductive layer (a second conductive layer having an insulator mixture region) including an insulator may be formed by mixing the insulators into the second conductive layer, or a first conductive layer (a first conductive layer having an insulator mixture region) including an insulator and a second conductive layer (a second conductive layer having an insulator mixture region) including an insulator may be formed by mixing an insulator into both the first conductive layer and the second conductive layer.

In the memory device of FIG. 10 according to this embodiment mode, the organic compound layer 312 forming a memory element that is included in the memory device is formed over the first conductive layers 306a and 306b containing the insulators 326a and 326b respectively. When voltage is applied between the first conductive layer and the second conductive layer, current flows through the organic compound layer 312 and heat is generated. By such effect of heat and a high electric field, the film thickness of the organic compound layer becomes uneven, and the organic compound layer is transformed so that the first conductive layer is in contact with the second conductive layer. Accordingly, the first conductive layer and the second conductive layer are short-circuited. Accordingly, the conductivity of the memory element changes before and after applying voltage.

The insulators 326a and 326b existing at the interface of the organic compound layer 312 and the first conductive layers 306a and 306b allow tunnel injection of carriers from the first conductive layers 306a and 306b to the organic compound layer 312. Therefore, characteristics of a memory element such as a writing voltage are stabilized without voltage variations. Consequently, writing can be performed normally in each element. In addition, since a plurality of insulators are mixed into a conductive layer, physical impact can be avoided as compared to the case in which an insulating layer is formed on the conductive layer. Therefore film separation and defective shape are hard to occur during a manufacturing process. Therefore, because insulators can be provided in a stable state at the interface of a conductive layer and an insulating layer, a defective element where conductive layers are short-circuited in an initial state can be prevented from manufacturing. As a result, a memory device and a semiconductor device with high reliability can be provided with high yield.

In addition, due to a state that insulator is mixed in a conductive layer or a form that complexing insulator and a conductive layer, a film is tolerant of damage. Therefore flexibility of a process which is chosen is extended. Therefore, a process making a memory element, memory can be set more efficiently, reduction of production cost, and enhancement of productivity can be achieved.

An element having a rectifying property may be provided at the opposite side of the organic compound layer 312 through the first conductive layer 306a and the first conductive layer 306b. For example, a diode including a third conductive layer and a semiconductor layer is provided to be in contact with the first conductive layers 306a and 306b. Note that an element having a rectifying property may be provided at the opposite side of the organic compound layer through the second conductive layer. Also in the memory element 315a, a rectifying element may be provided between the first conductive layer 306a containing the insulators 326a and the organic compound layer 312, or between the organic compound layer 312 and the second conductive layer 313. The rectifying element can also be provided to use the above material. Note that, the same applies to the memory element 315b.

In this embodiment mode, the conductive layer 343 serving as an antenna is provided over the conductive layer 342 which is formed in the same layer as the second conductive layers 313. A conductive layer serving as an antenna may be formed in the same layer as the second conductive layer 313.

As a material of the conductive layer 343 serving as an antenna, an element selected from gold (Au), platinum (Pt), nickel (Ni), tungsten (W), molybdenum (Mo), cobalt (Co), copper (Cu), aluminum (Al), manganese (Mn), and titanium (Ti) or an alloy containing a plurality of the elements can be used. As a method for forming the conductive layer 343 serving as an antenna, evaporation, sputtering, CVD, various kinds of printing methods such as screen printing and gravure printing, a dispenser method, a droplet discharging method, or the like can be used.

Each of the transistors 310a, 310b, 310c, and 310d included in the element forming layer 335 can be provided by a p-channel TFT or an n-channel TFT, or a CMOS circuit combining a p-channel TFT and an n-channel TFT. Further, any structure may be used for semiconductor layers included in the transistors 310a, 310b, 310c, and 310d. For example, an impurity region (including a source region, a drain region, and an LDD region) may be formed, and either a p-channel type or an n-channel type may be employed. An insulating layer (sidewall) may be formed to be in contact with a side face of the gate electrode, or a silicide layer may be formed for either or both of source and drain regions and the gate electrode. As a material for the silicide layer, nickel, tungsten, molybdenum, cobalt, platinum, or the like can be used.

Each of the transistors 310a, 310b, 310c, and 310d included in the element forming layer 335 may be provided using an organic transistor in which a semiconductor layer forming each of the transistors is formed of an organic compound. In this case, the element forming layer 335 including the organic transistor can be formed using a printing method, a droplet discharging method or the like, directly over the substrate 300 having flexibility such as plastic substrate. By using a printing method, a droplet discharging method, or the like, a semiconductor device can be manufactured at lower cost.

The element forming layer 335, the memory elements 315a and 315b, and the conductive layer 343 that functions as an antenna can be formed using an evaporation method, a sputtering method, a CVD method, a printing method, a dispenser method, a droplet discharging method, or the like, as mentioned above. Further, they may be formed by different methods depending on portions to be formed. For example, a transistor requiring high speed operation can be provided by forming a semiconductor layer that is made of Si or the like over a substrate and then crystallizing it by a thermal treatment; subsequently, a transistor that functions as a switching element can be provided as an organic transistor using a printing method or a droplet discharging method, over an element forming layer.

Note that a sensor may be provided to be connected to the transistors. As a sensor, an element which detects temperature, humidity, illuminance, gas, gravity, pressure, sound (vibration), acceleration, and other characteristics by physical means or chemical means, can be given. The sensor is typically formed by a semiconductor element such as a resistor element, a capacitive coupling element, an inductive coupling element, a photovoltaic element, a photoelectric conversion element, a thermoelectromotive force element, a transistor, a thermistor, or a diode.

Next, an example of a structure of a semiconductor device will be described with reference to FIG. 11, in the case where a terminal portion is provided over a substrate including a plurality of elements and memory elements and connected to an antenna provided over another substrate.

Figure 11:
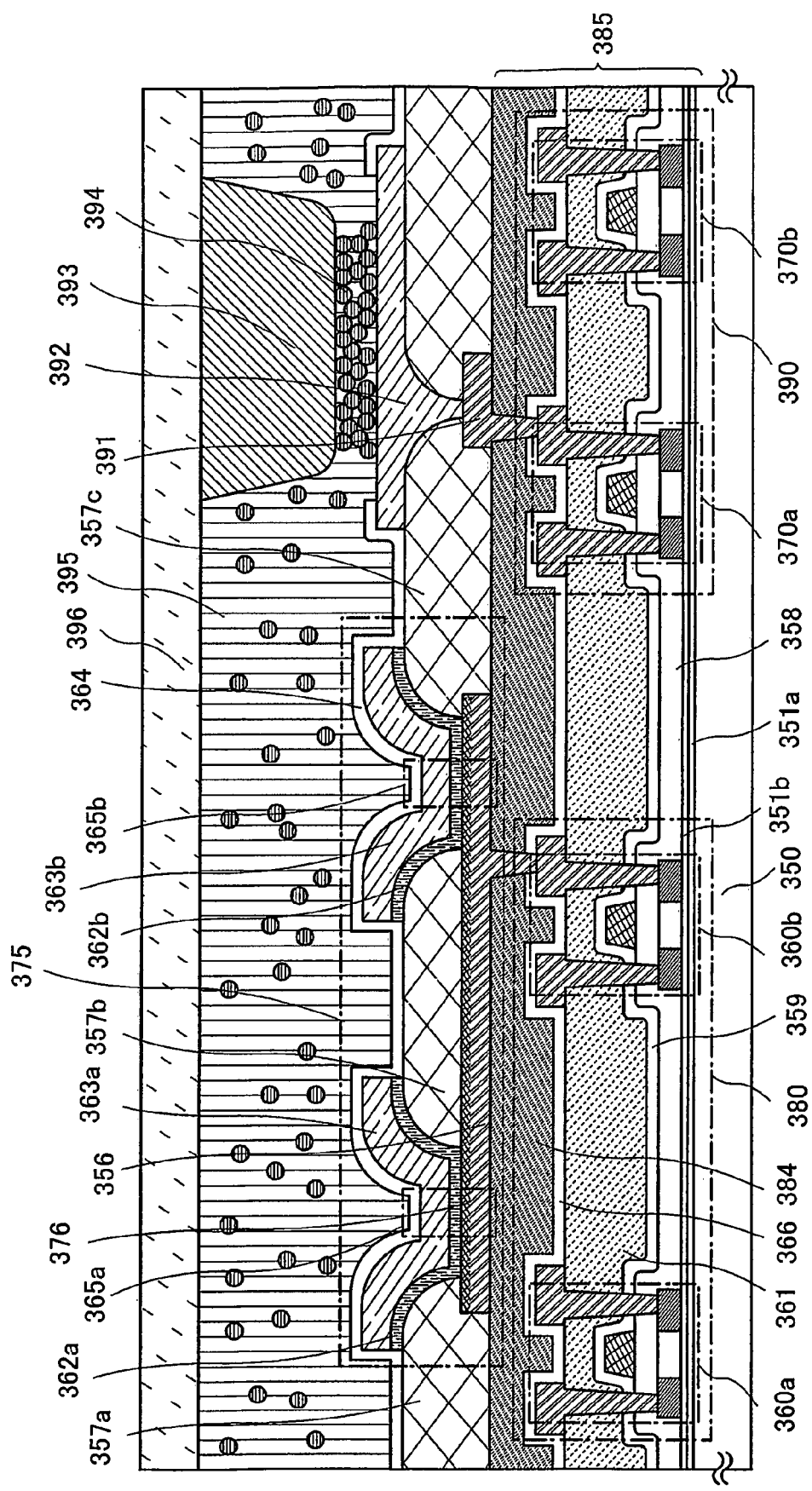
FIG. 11 is a diagram explaining a semiconductor device of the present invention.

FIG. 11 shows a semiconductor device which has a memory device that is structured as a passive matrix type, in which an element forming layer 385 including a transistor portion 380 having transistors 360a and 360b; a transistor portion 390 having transistors 370a and 370b; and insulating layers 351a, 351b, 358, 361, 366, and 384, are provided over a substrate 350. Furthermore, a memory element portion 375 is formed over the element forming layer 385, and a conductive layer 393 serving as an antenna is provided over a substrate 396 to be connected to the element forming layer 385. Here, the case in which the memory element portion 375 or the conductive layer 393 serving as an antenna is provided in the upper side of the element forming layer 385, is shown; however, the present invention is not limited to this structure. It is possible to form the memory element portion 375 in the lower side of the element forming layer 385 or in the same layer thereof. Alternatively, it is also possible to form the conductive layer 393 serving as an antenna in the lower side of the element forming layer 385.

The memory element portion 375 includes a memory element 365a and a memory element 365b. The memory element 365a is formed by stacking partition walls (insulating layers) 357a and 357b, an organic compound layer 362a, and a second conductive layer 363a over a first conductive layer 356 having an insulator mixture region 376. The memory element 365b is provided by stacking the partition walls (insulating layers) 357b and 357c, the organic compound layer 362b, and the second conductive layer 363b over the first conductive layer 356 having the insulator mixture region 376. Further, an insulating layer 364 serving as a protective film is formed to cover the second conductive layers 363a and 363b. In addition, the first conductive layer 356 having the insulator mixture region 376 over which the plurality of memory elements 365a and 365b are formed is connected to a source electrode layer or a drain electrode layer of the one transistor 360b. In other words, the memory elements are connected to one and the same transistor. Also, for the organic compound layers 362a and 362b, the partitions (insulating layers) 357a, 357b, and 357c are provided to separate the organic compound layers for each memory cell; however, if there is no concern for an influence of an electric field in the lateral direction between adjacent memory cells, an insulating layer may be formed over the entire surface. Note that the memory elements 365a and 365b can be formed using the materials or the manufacturing methods shown in the above embodiment modes.

The mixture state of the plurality of insulators in the first conductive layer 356 shown in FIG. 11 is an example, and the concentration of the insulators and the like can be controlled, as shown in FIG. 17, by the property and size of materials used as a plurality of insulators, a material used as a conductive layer, and a forming method. In addition, as shown in FIGS. 1B and 1C and FIGS. 17B and 17C, a second conductive layer (a second conductive layer having an insulator mixture region) including an insulator may be formed by mixing the insulators into the second conductive layer, or a first conductive layer (a first conductive layer having an insulator mixture region) including an insulator and a second conductive layer (a second conductive layer having an insulator mixture region) including an insulator may be formed by mixing an insulator into both the first conductive layer and the second conductive layer.

In the memory device of FIG. 11 according to embodiment mode, the organic compound layers 362a and 362b forming a memory element that is included the memory device are formed over the first conductive layer 356 having the insulator mixture region 376. When voltage is applied between the first conductive layer and the second conductive layer, current flows through the organic compound layers 362a and 362b, and heat is generated. Due to such effect of heat and a high electric field, the film thickness of the organic compound layer becomes uneven, and the organic compound layer is transformed so that the first conductive layer is in contact with the second conductive layer. Accordingly, the first conductive layer and the second conductive layer are short-circuited. Accordingly, the conductivity of the memory element changes before and after applying voltage.

The insulators existing at the interface of the organic compound layers 362a and 362b, and the first conductive layer 356 allow tunnel injection of carriers from the first conductive layer 356 to the organic compound layers 362a and 362b. Consequently, characteristics of a memory element such as a writing voltage are not varied to be stabilized. Consequently, writing can be performed normally in each element. In addition, since insulators are mixed into a conductive layer, physical impact can be avoided as compared to the case in which an insulating layer is formed on the conductive layer. Therefore, film separation and defective shape are hard to occur during a manufacturing process. Because a plurality of insulators can be provided in a stable state at the interface of a conductive layer and an insulating layer, a defective element where conductive layers are short-circuited in an initial state can be prevented from being manufactured, and high reliability memory element and semiconductor device can be provided at high yield.

In addition, since a plurality of insulators are mixed into the conductive layer or a plurality of insulators are combined with the conductive layer, the flexibility of a process, which is chosen with considering the robustness of film, is extended. Therefore, a memory element and a memory device can be manufactured more efficiently, and reduction of production cost and enhancement of productivity can be achieved.

An element having a rectifying property may be provided at the opposite side of the organic compound layer 362a and the organic compound layer 362b through the first conductive layer 356. Here, a diode including a third conductive layer and a semiconductor layer is provided to be in contact with the first conductive layer 356. Note that an element having a rectifying property may be provided at the opposite side of the organic compound layer through the second conductive layer.

The substrate including the element forming layer 385 and the memory element portion 375 is attached to the substrate 396 provided with the conductive layer 393 serving as an antenna with an adhesive resin 395. The element forming layer 385 and the conductive layer 393 are electrically connected to each other through conductive fine particles 394 contained in the resin 395. Alternatively, the substrate including the element forming layer 385 and the memory element portion 375 may be attached to the substrate 396 provided with the conductive layer 393 serving as an antenna with a conductive adhesive such as silver paste, copper paste, or carbon paste, or by solder bonding.

Thus, a semiconductor device provided with a memory device and an antenna can be formed. In addition, in this embodiment mode, an element forming layer can be provided by forming a thin film transistor over a substrate. Alternatively, a semiconductor substrate such as a Si substrate is used as a substrate, and an element forming layer may be provided by forming a filed effect transistor over the substrate. Furthermore, an SOI substrate may be used as a substrate and an element forming layer may be provided thereover. In this case, the SOI substrate may be formed by attaching wafers or by using a method called SIMOX in which an insulating layer is formed inside a substrate by implanting oxygen ions into a Si substrate.

In addition, a memory element portion may be provided over a substrate provided with a conductive layer serving as an antenna. Further, a sensor connected to a transistor may be provided.

Note that this embodiment mode can be freely combined with the above embodiment modes. Further, the semiconductor device manufactured in this embodiment may be separated from the substrate by a known separation step and attached to a flexible substrate to be provided over a flexible substratum. Then, a semiconductor device having flexibility can be obtained. The flexible substratum corresponds to a film made of polypropylene, polyester, vinyl, polyvinyl fluoride, polyvinyl chloride, or the like, paper made from a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like. The films are subjected to a heat treatment and a pressure treatment by thermocompression bonding. An adhesive layer that is provided on the outermost surface of the layer, or a layer (not an adhesive layer) that is provided on the outermost layer thereof and melted by a heart treatment, and then is pressured, so that the films are attached. An adhesive layer may be provided on the substratum or it may not be provided. The adhesive layer corresponds to a layer containing an adhesive such as a thermosetting resin, a UV curing resin, an epoxy resin-based adhesive, and a resin additive.

With a memory element of the present invention, characteristics of a memory element such as a writing voltage are stabilized without variations. Consequently, writing can be performed normally in each element. In addition, because carrier injection characteristics are improved by tunneling current of a mixed layer of an inorganic insulator and an organic compound, the thickness of an insulating layer can be increased. Therefore, failure of a memory element can be prevented such as a short-circuit in an initial state before electric conduction. As a result, a memory device and a semiconductor device with high reliability can be provided with high yield.

Embodiment Mode 5

In this embodiment mode, reading or writing of data in a semiconductor device having the above structure will be described.

Writing data to the semiconductor device having the above structure can be performed by an electrical action. Data writing which is carried out by applying an electrical action will be explained (see FIG. 3).

When writing data is performed by an electrical action, one of the memory cells 721 is selected by the row decoder 724a, the column decoder 726a, and the selector 726c, and then, data is written to the memory cell 721 with the use of a writing circuit. Specifically, a high voltage is selectively applied to the organic compound layer 752 in a desired portion, and a large amount of current is fed so that the first conductive layer 751b and the second conductive layer 753b are short-circuited.

The electric resistance of the short-circuited portion is much smaller than that of the other portions. Thus, by adding the electrical action, writing data is performed by utilizing a change in the electric resistance between the two conductive layers. For example, in the case where an insulating layer to which the electrical action is not added, is used as data "0", when writing data "1", a high voltage is selectively applied to the insulating layer in a desired portion, and a large amount of current is fed to cause a short-circuit and to decrease the electric resistance.

Figure 9:
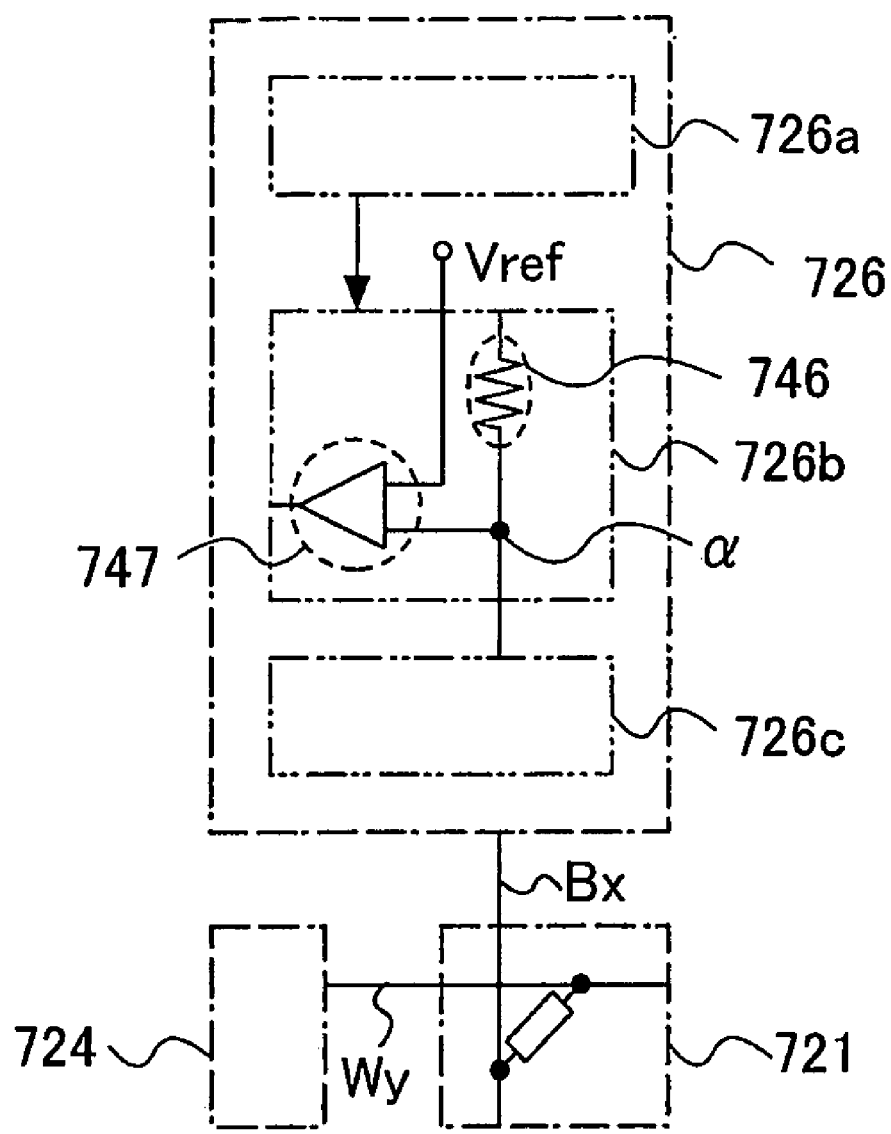
FIG. 9 is a diagram explaining a memory device of the present invention.

Subsequently, operation in the case of reading data from a memory element will be described (see FIG. 9). Here, a reading circuit 726b includes a resistance element 746 and a sense amplifier 747. However, the reading circuit 726b is not limited to the above structure, and the reading circuit may have any structure.

Data readout is carried out by applying voltage between the first conductive layer 751b and a second conductive layer 753b, and reading the electrical resistance of the organic compound layer 752. (see FIGS. 2A to 2C) For example, in the case of writing data by an electrical action as described above, a resistance value Ra1 in the case where the electrical action is not added, and a resistance value Rb1 in the case where the electric action is added so that the two conductive layers are short-circuited, satisfy Ra1>Rb1. Reading data is performed by electrically reading such a difference in the resistance value.

For example, data of the memory cell 721 disposed in the x-th column and the y-th row is read among the plurality of memory cells 721 included in the memory cell array 722. In that case, first, a bit line Bx in the x-th column and a word line Wy in the y-th row are selected by the row decoder 724a, the column decoder 726a, and the selector 726c. Then, the insulating layer included in the memory cell 721 and the resistance element 746 is in such a state that they are connected in series. Thus, when voltage is applied to the opposite ends of the two serially-connected resistance elements, the potential of a node α is divided in accordance with the resistance value Ra or Rb of the organic compound layer 752. The electric potential of the node α is supplied to a sense amplifier 747. In the sense amplifier 747, which of the information "0" and "1" is contained is judged. After that, a signal containing the information "0" or "1" judged by the sense amplifier 747 is supplied to the outside.

In accordance with the above method, the state of the resistance of an insulating layer is read from a voltage value utilizing the difference in resistance value and resistance division. However, a method in which current values are compared may be employed. This method, for example, utilizes that a current value Ia1 in the case where the electrical action is not added to the insulating layer, and a resistance value Ib1 in the case where the electrical action is added to the insulating layer so that the two conductive layers are short-circuited, satisfy Ia1<Ib1. Thus, reading data may be performed by electrically reading the difference in the current value.

A memory element having the above structure and a semiconductor device that is equipped with the memory element are nonvolatile memories; therefore, a battery for retaining data need not be built in, and a compact size, thin, and light weight semiconductor device can be provided. Further, by using the insulating material that is used in the above embodiment mode as an insulating layer, rewriting data cannot be performed though writing data (additionally) is possible. Accordingly, forgery can be prevented and a semiconductor device with ensured security can be provided.

It is to be noted that a memory element having a passive matrix memory circuit which has a simple structure and a semiconductor device provided with the memory element are described as examples in this embodiment mode. However, even in the case of using an active matrix memory circuit, data can be written or read in a similar manner.

Here, in the case of an active matrix structure, a specific example of reading data from a memory element by an electrical action will be described with reference to FIGS. 14A and 14B.

Figure 14A:
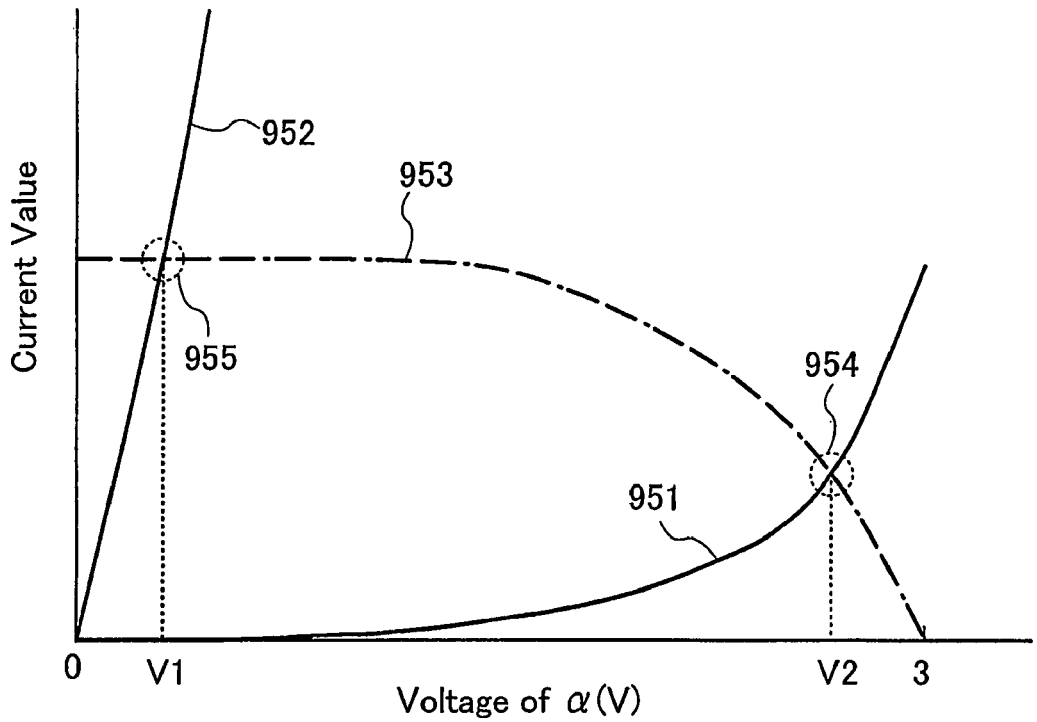
FIGS. 14A and 14B are diagrams explaining a memory device of the present invention.

FIG. 14A shows a current-voltage characteristic 951 of a memory element portion when data "0" is written to the memory element portion; a current-voltage characteristic 952 of the memory element portion when data "1" is written; and a current-voltage characteristic 953 of a resistance element 246. Here, a case in which a transistor is used for the resistance element 246 is shown. Further, a case where 3 V is applied between the first conductive layer 243 and the second conductive layer 245 as operation voltage when reading data, will be described.

Figure 14B:
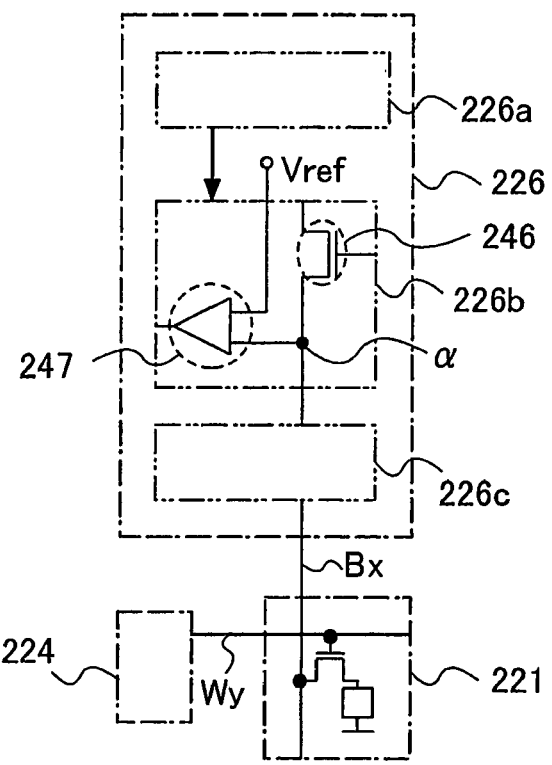

In FIGS. 14A and 14B, in a memory cell having a memory element portion to which data "0" is written, an intersection point 954 of the current-voltage characteristic 951 of the memory element portion and the current-voltage characteristic 953 of the transistor is an operational point, and the potential of a node α at this time is V1 (V). The potential of the node α is supplied to a sense amplifier 247. The data stored in the memory cell is recognized as "0" in the sense amplifier 247.

Meanwhile, in a memory cell having a memory element portion to which data "1" is written, an intersection point 955 of the current-voltage characteristic 952 of the memory element portion and the current-voltage characteristic 953 of the transistor is an operational point, and the potential of a node α at this time is V2 (V) (V1>V2). The potential of the node α is supplied to the sense amplifier 247. The data stored in the memory cell is recognized as "1" in the sense amplifier 247.

Thus, the data stored in the memory cell can be recognized by reading the potential which is divided in accordance with the resistance value of a memory element portion 241.

It is to be noted that this embodiment mode can be freely combined with any of the structures of the memory element and the semiconductor device provided with the memory element shown in the above embodiment mode.

Embodiment Mode 6

Figure 12A:
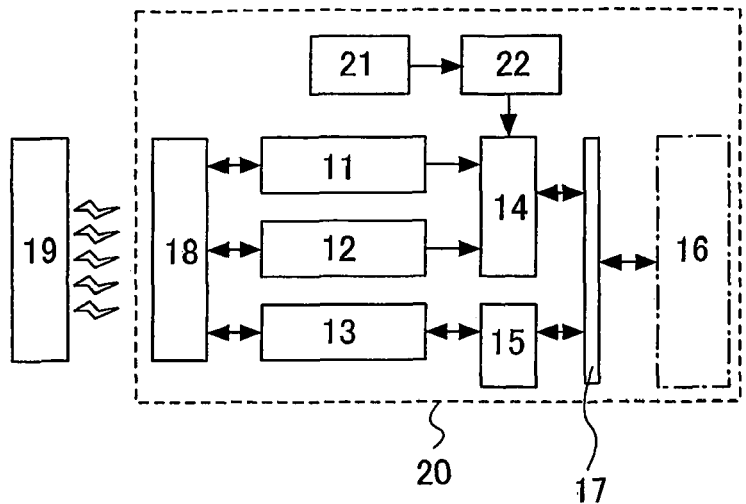
FIGS. 12A and 12B are diagrams explaining a method for manufacturing of a semiconductor device of the present invention.
Figure 12B:
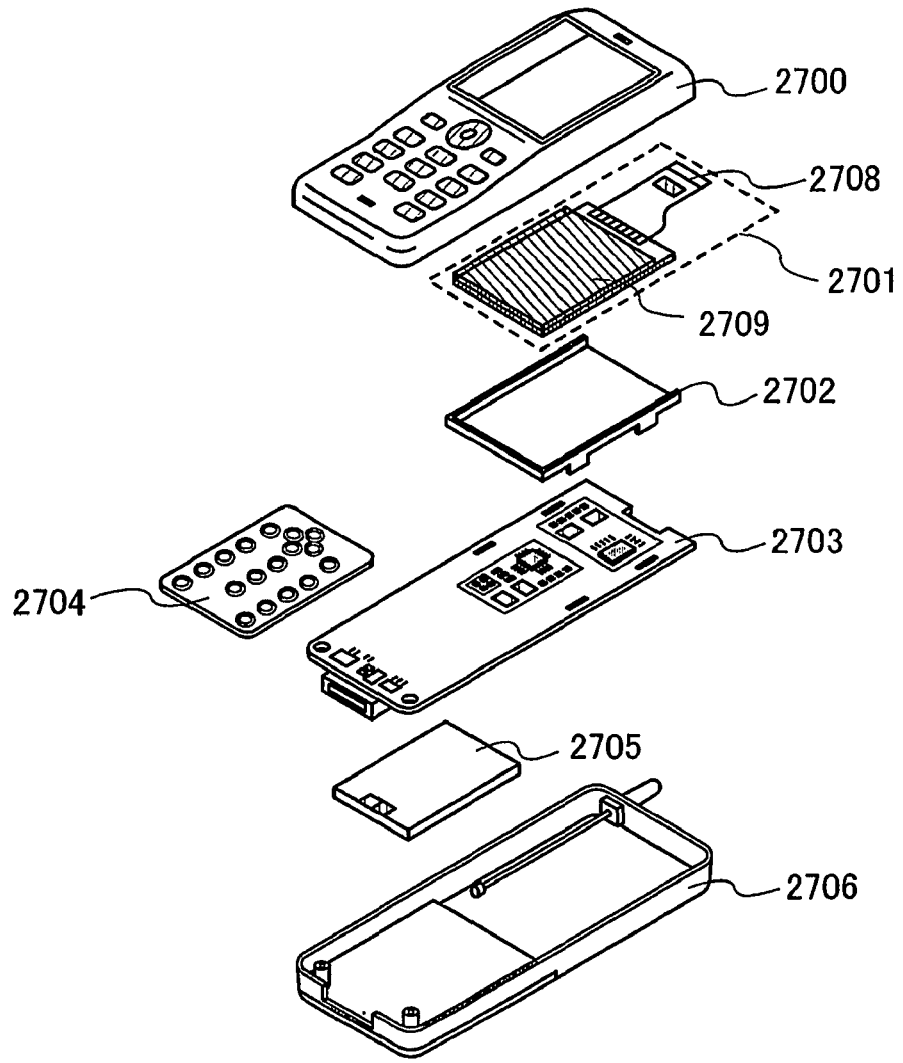

The structure of a semiconductor device of this embodiment mode will be explained with reference to FIGS. 12A and 12B. As shown in FIG. 12A, a semiconductor device 20 of the present invention has a function of data exchange without contact, and has a power source circuit 11; a clock generation circuit 12; a data demodulation/modulation circuit 13; a control circuit 14 which controls other circuits; an interface circuit 15; a memory circuit 16; a data bus 17; an antenna (antenna coil) 18; a sensor 21; and a sensor circuit 22.

The power supply circuit 11 generates various kinds of power sources to be supplied to each circuit in the semiconductor device 20 based on alternating current signals input from the antenna 18. In the clock generation circuit 12, various kinds of clock signals to be supplied to each circuit in the semiconductor device 20 are generated in accordance with an AC signal inputted from the antenna 18. The data demodulation/modulation circuit 13 has a function of demodulating/modulating data communicated with a reader/writer 19. The control circuit 14 has a function of controlling the memory circuit 16. The antenna 18 has a function of transmitting/receiving electromagnetic fields or ratio waves. The reader/writer 19 communicates with and controls the semiconductor device, and processes the data of the semiconductor device. Note that the configuration of the semiconductor device is not limited to the aforementioned one, and other elements, for example such as a limiter circuit of a power supply voltage and hardware dedicated to encryption may be additionally provided.

The memory circuit 16 has a memory element where an insulating layer or a phase change layer is interposed between a pair of conductive layers. It is to be noted that the memory circuit 16 may have only the memory element where an insulating layer or a phase change layer is interposed between a pair of conductive layers, or may have another memory circuit with a different structure. The memory circuit with a different configuration corresponds, for example, to one or more of a DRAM, an SRAM, an FeRAM, a mask ROM, a PROM, an EPROM, an EEPROM, and a flash memory.

The sensor 21 is formed using a semiconductor element such as a resistance element, a capacitive coupling element, an inductive coupling element, a photovoltaic element, a photoelectric conversion element, a thermal electromotive force element, a transistor, a thermistor, and a diode. The sensor circuit 22 detects changes in impedance, reactance, inductance, voltage, or current, and performs analog/digital (A/D) conversion to output a signal to the control circuit 14.

Embodiment Mode 7

In accordance with the present invention, a semiconductor device serving as a processor chip (also referred to as a wireless chip, a wireless processor, a wireless memory, and a wireless tag) can be formed. The usage of the semiconductor device of the present invention is wide-ranging. For example, the semiconductor device can be used by being provided on paper money, coin, securities, certificates, bearer bonds, packing containers, documents, recording medium, personal belongings, vehicles, foods, garments, health articles, livingware, medicines, electronic apparatuses, and the like.

Figure 13A:
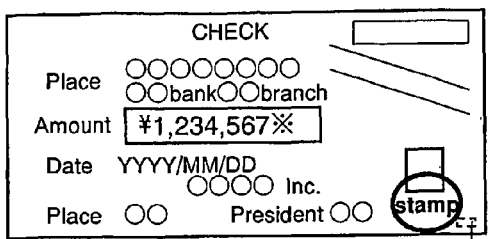
FIGS. 13A to 13G are diagrams explaining application examples of the semiconductor device of the present invention.
Figure 13B:
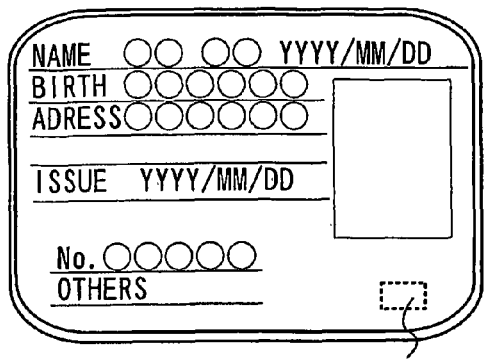
Figure 13C:
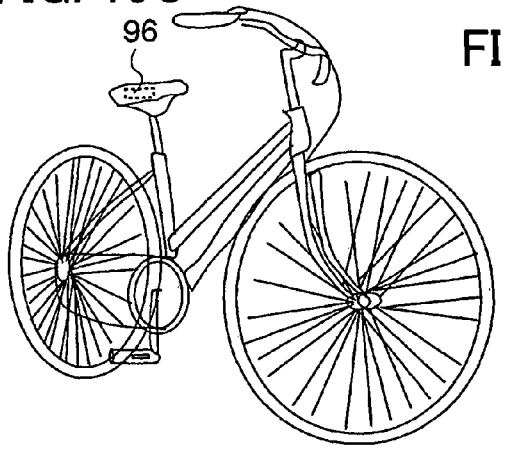
Figure 13D:
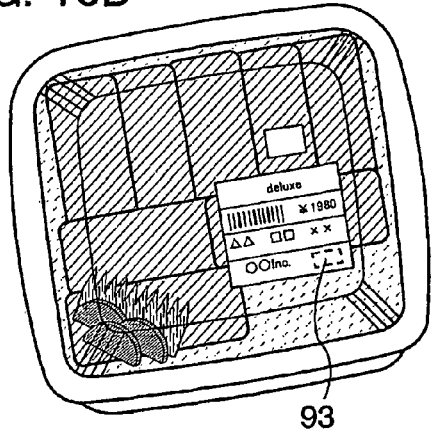
Figure 13E:
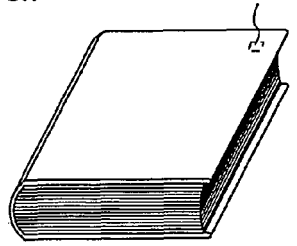
Figure 13F:
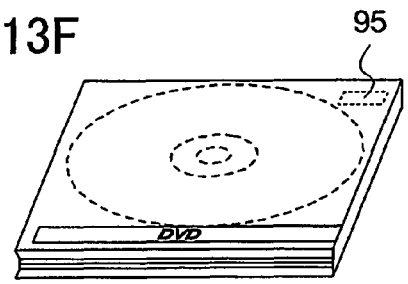
Figure 13G:
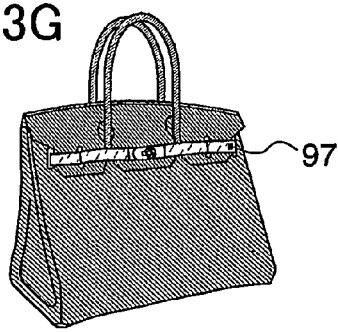

The paper money and coins are money distributed in the market and include currency (cash vouchers) available in a certain area in a similar way to money, memorial coins, and the like. The securities refer to checks, stock certificates, promissory notes, and the like, which can be provided with a processor chip 90 (see FIG. 13A). The certificates refer to driver's licenses, certificates of residence, and the like, which can be provided with a processor chip 91 (see FIG. 13B). The vehicles refer to wheeled vehicles such as bicycles, vessels, and the like, which can be provided with a processor chip 96 (FIG. 13C). The bearer bonds refer to stamps, rice coupons, various merchandise coupons, and the like. The packing containers refer to wrapping paper for a box lunch, plastic bottles, and the like, which can be provided with a processor chip 93 (see FIG. 13D). The documents refer to volumes, books and the like, which can be provided with a processor chip 94 (see FIG. 13E). The recording medium refer to DVD software, video tapes, and the like, which can be provided with a processor chip 95 (see FIG. 13F). The personal belongings refer to a bag, a pair of glasses, and the like, which can be provided with a processor chip 97 (see FIG. 13G). The foods refer to eatables, drinks, and the like. The garments refer to clothes, chaussures, and the like. The health articles refer to medical appliances, health appliances, and the like. The livingware refers to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

The semiconductor device according to the present invention is fixed to products by mounting the device onto a printed substrate, pasting the device to the surface, or embedding the device in the products. For example, the semiconductor device may be embedded in paper of a book, or embedded in an organic resin of a package that is formed using the organic resin. Since the semiconductor device according to the present invention is realized to be small, thin, and lightweight, design of a product is not detracted after fixating the semiconductor device to the product. A certification function can be provided by providing the semiconductor device of the invention to the paper money, the coins, the securities, the bearer bonds, the certificates, and the like. In addition, by providing the semiconductor devices of the invention to wrapping containers, recording medium, belongings, foods, clothes, livingware, electronic apparatuses, and the like, a system such as an inspection system can be performed efficiently.

Next, an example of an electronic apparatus equipped with a semiconductor device of the present invention will be described with reference to the drawing. The electronic apparatus shown here is a cellular phone including frame bodies 2700 and 2706, a panel 2701, a housing 2702, a printed wiring board 2703, operation switches 2704, and a battery 2705 (see FIG. 12B). The panel 2701 is incorporated in the housing 2702 in a detachable manner, and the housing 2702 is fitted into the printed wiring board 2703. The housing 2702 is appropriately changed in shape and size in accordance with an electronic apparatus incorporating the panel 2701. A plurality of semiconductor devices that are packaged are mounted over the printed wiring board 2703. The semiconductor device of the present invention can be used as one of the plurality of semiconductor devices. The plurality of semiconductor devices mounted over the printed wiring board 2703 have any of the functions of a controller, a central processing unit (CPU), a memory, a power supply circuit, an audio processing circuit, a transmitting/receiving circuit, and the like.

The panel 2701 is connected to the printed wiring board 2703 through a connection film 2708. The panel 2701, the housing 2702, and the printed wiring board 2703 are housed in the housings 2700 and 2706 together with the operation buttons 2704 and the battery 2705. A pixel region 2709 included in the panel 2701 is arranged so as to be recognized by sight through an opening window provided in the housing 2700.

As set forth above, the semiconductor device of the present invention is small, thin, and lightweight, and therefore, a limited space inside of the housings 2700 and 2706 of the electronic apparatus can be efficiently utilized.

In addition, since the semiconductor device according to the present invention includes a memory element having a simple structure in which an insulating layer is interposed between a pair of conductive layers, an electric apparatus using an inexpensive semiconductor device can be provided. In addition, since the semiconductor device of the present invention can be highly integrated easily, an electronic apparatus using the semiconductor device having a high-capacity memory circuit can be provided.

In addition, a memory device in the semiconductor device according to the present invention is nonvolatile and additionally recordable, and the data is written to the memory device by electrical action. Accordingly, forgery due to rewriting can be inhibited while adding new data to the memory device. Accordingly, an electronic apparatus using a high-performance and high-value added semiconductor device can be provided.

It is to be noted that the housings 2700 and 2706 are shown as an example of an exterior of the cellular phone, and the electric apparatus according to the present embodiment mode can be changed variously in accordance with the function or the intended purpose thereof.

Embodiment Mode 8

In this embodiment mode, reading or writing data in a semiconductor device having the above structure will be described.

FIG. 18A shows an example of a structure of a semiconductor device according to the present invention. The semiconductor device includes a memory cell array 1722 in which memory cells 1721 are arranged in matrix, a circuit 1726 having reading and writing circuits, a decoder 1724, and a decoder 1723. It is to be noted that the structure of a memory device 1716 shown here is only an example, and the semiconductor device may include another circuit such as a sense amplifier, an output circuit, a buffer, and an interface that communicates with outside.

The memory cell 1721 includes a first conductive layer that is connected to a bit line Bx ($1 \leq x \leq m$), a second conductive layer that is connected to a word line Wy ($1 \leq y \leq n$), and an insulating layer. The insulating layer has a single layer structure or a stacked layers structure between the first conductive layer and the second conductive layer.

An operation when carrying out data writing in a memory element of a passive matrix type memory device is explained with reference to FIGS. 18A and 19C. Data is written by optical action or electrical action. First, the case of writing data by electrical action is described. It is to be noted that writing is performed by changing electric characteristics of the memory cell, and an initial state (state without electrical action) of the memory cell is data "0" and a state in which electric characteristics is changed is data "1".

In the case of writing data "1" to the memory cell 1721, the memory cell 1721 is selected first by the decoders 1723 and 1724 and a selector 1725. Specifically, a predetermined voltage V2 is applied to a word line W3 connected to the memory cell 1721 by the decoder 1724. A bit line B3 connected to the memory cell 1721 is connected to a circuit 1726 by the decoder 1723 and the selector 1725. Then, a writing voltage V1 is outputted from the circuit 1726 to the bit line B3. Thus, a potential (voltage) Vw=V1-V2 is applied between the first conductive layer and the second conductive layer included in the memory cell 1721.

An insulating layer provided between the conductive layers is changed physically or electrically by appropriately selecting a potential Vw so that data "1" is written. Specifically, as for a readout operation voltage, electric resistance between the first and second conductive layers in the state of the data "1" may be largely lowered than electric resistance therebetween in the state of data "0". For example, the voltage (V1, V2) may be arbitrarily selected from a range of (0 V, 5 to 15 V) or a range of (3 to 5 V, -12 to -2 V). The electric potential Vw may be 5 to 15 V or -5 to -15 V.

Note that non-selected word lines and non-selected bit lines are controlled such that data "1" is not written to the memory cells connected to the non-selected word and bit lines. For example, the non-selected word lines and the non-selected bit lines may be brought into a floating state. A portion between the first and second conductive layers included in one memory cell is required to characteristics by which selectivity can be secured, such as diode characteristics.

On the other hand, in the case of writing data "0" to the memory cell 1721, electrical action is not required to be applied to the memory cell 1721. In circuit operation, for example, the memory cell 1721 is selected by the decoders 1723 and 1724 and the selector 1725 in the same way as the case of writing data "1". Then, the output potential from the circuit 1726 to the bit line B3 may be set to be substantially equal to the potential of a selected word line W3 or the potential of a non-selected word line, and such a voltage (for example, -5 to 5 V) that does not change the electrical characteristics of the memory cell 1721 may be applied between the first conductive layer and the second conductive layer included in the memory cell 1721.

Next, the case of writing data by optical action will be described. In this case, the second conductive layer is required to transmit laser light. The insulating layer is irradiated with the laser light from a conductive layer side that has a light transmitting property. Here, the insulating layer in a desired portion is selectively irradiated with laser light to destroy the insulating layer. The destroyed insulating layer is insulated, and therefore, the electric resistance is significantly increased compared with that in another portion. Data is thus written by utilizing the phenomenon that the electric resistance between two conductive layers provided so as to interpose the insulating layer is changed by laser irradiation. For example, in the case where an insulating layer that is not irradiated with laser light is used for "0", when writing data "1", an insulating layer in a desired portion is selectively irradiated with laser light and destroyed to increase the electric resistance.

When an insulating layer formed with a conjugate polymer doped with a compound generating acid by absorbing light (photoacid generator) is irradiated with laser light, the irradiated portion has high conductivity while the non-irradiated portion does not have conductivity. Therefore, the data is written utilizing the change in the electric resistance of the insulating layer by selectively irradiating an insulating layer in a desired portion with laser light. For example, in the case where an insulating layer that is not irradiated with laser light is used for "0", when writing data "1", an insulating layer in a desired portion is selectively irradiated with laser light to increase the conductivity.

The structure of the present invention in which data is written by laser light irradiation makes it possible to manufacture a lot of memory devices easily. Thus, a memory device and a semiconductor device can be provided at low cost.

An operation of carrying out data readout from a memory element in a passive matrix type memory device is explained (see FIGS. 18A to 18C). Reading out data is performed by utilizing a difference in electric characteristics between the first and second conductive layers between a memory cell having data "0" and a memory cell having data "1". For example, described below is a method for reading data by utilizing a difference in electric resistance in the case where effective electric resistance between the first and second conductive layers included in the memory cell having data "0" (hereinafter, simply referred to as electric resistance of the memory cell) is R0 at a reading voltage and electric resistance of the memory cell having data "1" is R1 at a reading voltage. Note that R1<<R0 is satisfied. For a structure of a readout portion of a reading/writing circuit, for example, the circuit 1726 using a resistance element 1746 and a differential amplifier 1747 shown in FIG. 18B can be used. The resistance element 1746 has a resistance value Rr (R1<Rr<R0). It is also possible to use a transistor 1748 in the place of the resistance element 1746, and a clocked inverter 1749 in the place of the differential amplifier (FIG. 18C). A signal φ or an inverted signal φ that is Hi when reading is performed and Lo when reading is not performed is inputted to the clocked inverter 1749. Needless to say, a circuit structure is not limited to that of FIGS. 18A to 18C.

In the case of reading data from the memory cell 1721, the memory cell 1721 is selected first by the decoders 1723 and 1724 and the selector 1725. Specifically, a predetermined voltage Vy is applied to a word line Wy connected to the memory cell 1721 by the decoder 1724. A bit line Bx connected to the memory cell 1721 is connected to a terminal P of the circuit 1726 by the decoder 1723 and the selector 1725. As a result, the potential Vp of the terminal P is a value determined by resistance division by resistance element 1746 (resistance value: Rr) and the memory cell 1721 (resistance value: R0 or R1). Therefore, Vp0=Vy+(V0−Vy)*R0/(R0+Rr) is satisfied in the case where the memory cell 1721 has data "0". Meanwhile, Vp1 Vy+(V0−Vy)*R1/(R1+Rr) is satisfied in the case where the memory cell 1721 has data "1". As a result, by selecting Vref so as to be between Vp0 and Vp1 in FIG. 18B; and by selecting a point of variation of the clocked inverter so as to be between Vp0 and Vp1 in FIG. 18C, reading can be carried out by outputting Lo/Hi (or Hi/Lo) as an output potential Vout, depending on data "0"/"1."

For example, the differential amplifier is operated in a case where Vdd is 3 V, and Vy is set to be 0 V, V0 is set to be 3 V, and Vref is set to be 1.5 V. If R0/Rr=Rr/R1=9 is satisfied, when the memory cell has data "0", Vp0 becomes 2.7 V and Hi is output as Vout. When the memory cell has data "1", Vp1 becomes 0.3 V and Lo is output as Vout. In this manner, reading from memory cells can be performed.

In accordance with the above method, the state of electric resistance of an insulating layer is read from a voltage value utilizing the difference in resistance value and resistance division. Of course, the reading method is not limited thereto. For example, the state of electric resistance may be read out by utilizing the difference in current value instead of utilizing the different in electric resistance. Further, when electrical characteristics of a memory cell have a diode property in which threshold voltage is different between data "0" and data "1", the state of electric resistance of the insulating layer may be read out by utilizing the difference in threshold voltage.

Figure 19A:
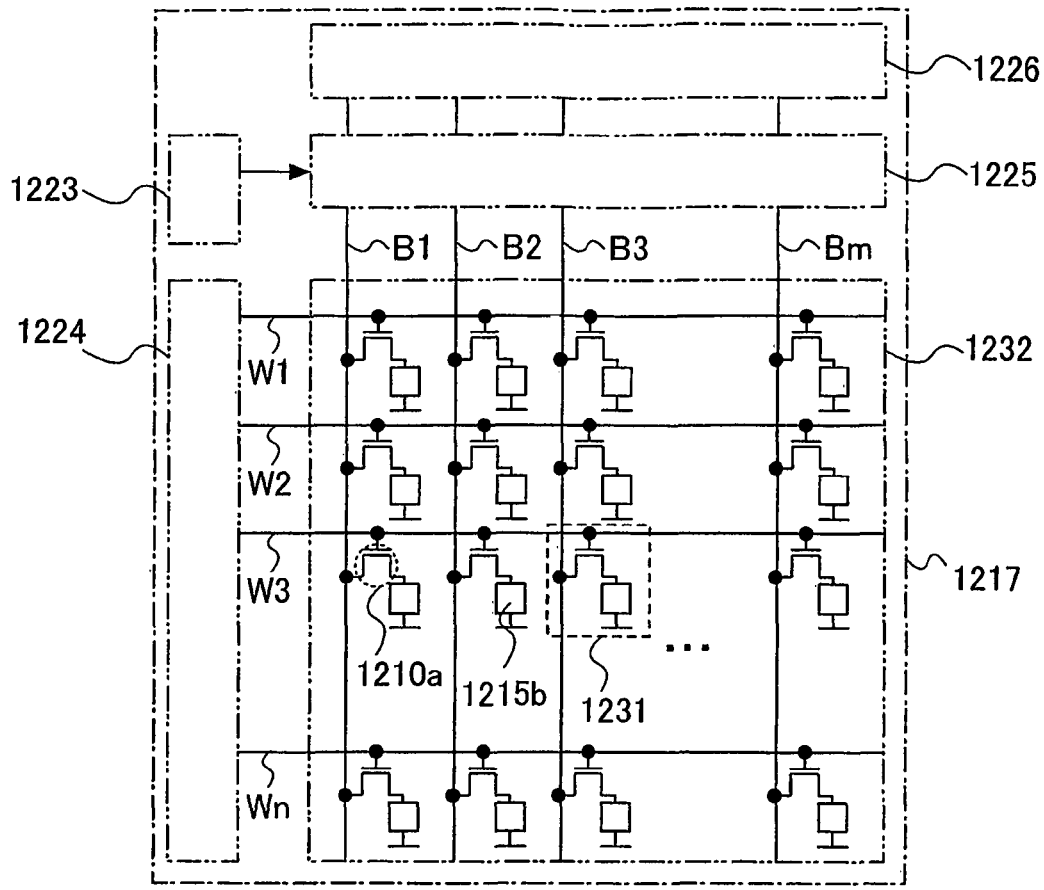
FIGS. 19A to 19C are diagrams explaining a memory device of the present invention.
Figure 19B:
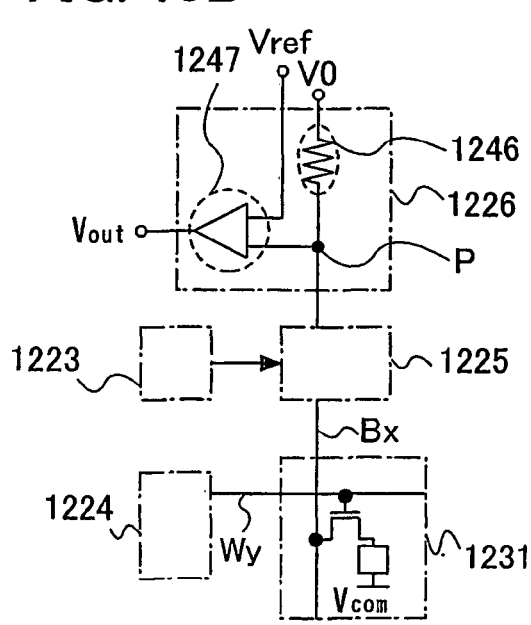
Figure 19C:
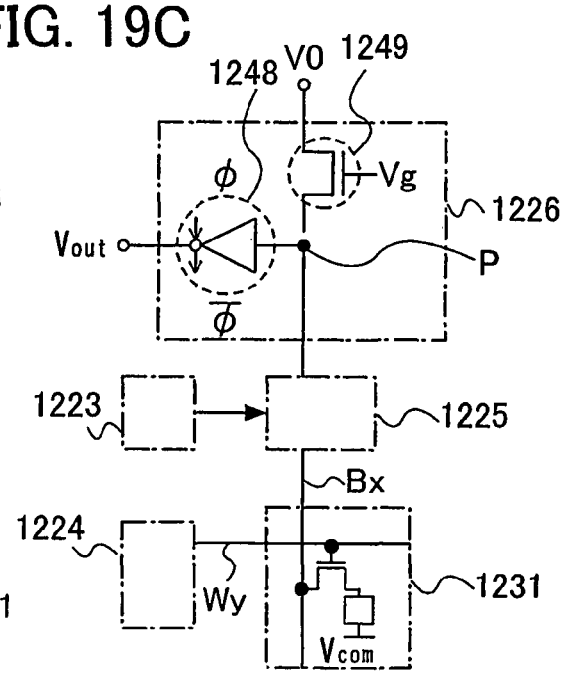

An operation when carrying out data writing in a memory element of an active matrix type memory device is explained (see FIGS. 19A to 19C).

FIGS. 19A to 19C show one structural example of a memory device that is shown in this embodiment mode, which includes a memory cell array 1232 in which memory cells 1231 are provided in matrix, a circuit 1226, a decoder 1224, and a decoder 1223. The circuit 1226 has a reading circuit and a writing circuit. It is to be noted that the structure of a memory device 1217 shown here is only an example, and the memory device may include another circuit such as a sense amplifier, an output circuit, a buffer, and an interface that communicates with outside.

The memory cell 1231 has a first wire that is connected to a bit line Bx (1≦x≦m), a second wire that is connected to a word line Wy (1≦y≦n), a transistor 1210*a*, and a memory element 1215*b*. The memory element 1215*b* has a structure in which an insulating layer is interposed between a pair of conductive layers. A gate electrode of the transistor is connected to the word line. Either a source electrode or a drain electrode is connected to the bit line, and the other electrode is connected to one of two terminals included in the memory element. The other terminal of the memory element is connected to a common electrode (potential, Vcom).

First, operation of writing data by electrical action will be described. It is to be noted that writing is performed by changing electrical characteristics of the memory cell, and an initial state (state without electrical action) of the memory cell is data "0" and a state in which electrical characteristics is changed is data "1".

Here, the case of writing data to the memory cell 1231 in the n-th row and m-th column will be described. In the case of writing data "1" to the memory cell 1231, the memory cell 1231 is selected first by the decoders 1223 and 1224 and the selector 1225. Specifically, a predetermined voltage V22 is applied to a word line Wn connected to the memory cell 1231 by the decoder 1224. In addition, a bit line Bm connected to the memory cell 1231 is connected to the circuit 1226 having a reading circuit and a writing circuit by the decoder 1223 and the selector 1225. Then, a writing voltage V21 is outputted from the circuit 1226 to a bit line B3.

In this manner, a transistor 1210*a* included in the memory cell is turned on, and the memory element 1215*b* is electrically connected to the bit line to apply a potential (voltage) of approximately Vw which is equal to Vcom−V21. It is to be noted that one of the electrodes of the memory element 1215*b* is connected to the common electrode of which potential is Vcom. An insulating layer provided between the conductive layers is changed physically or electrically by appropriately selecting a potential Vw so that data "1" is written. Specifically, in voltage of reading out operation, electric resistance between the first conductive layer and the second conductive layer in the state of data "1" is preferably lowered as compared to that in a state of data "0", or the first conductive layer and the second conductive layer may simply be short-circuited. Note that the potential V21 may be properly selected from 5 to 15V, the potential V22 may be properly selected from 5 to 15 V, and the potential Vcom may be 0 V. Alternatively, the potential V21 may be properly selected from −12 to 0 V, the potential V22 may be properly selected from −12 to 0

V, and the potential Vcom may be properly selected from 3 to 5 V. The potential Vw may be 5 to 15 V or −5 to −15 V.

Note that non-selected word lines and non-selected bit lines are controlled such that data "1" is not written to the memory cells connected to the non-selected word and bit lines. Specifically, a potential (e.g., 0 V), by which transistors of memory cells connected to the non-selected word lines are turned off, may be applied to the non-selected word lines whereas the non-selected bit lines may be brought into a floating state or applied with a potential, which is approximately equal to Vcom.

On the other hand, in the case of writing data "0" into the memory cell 1231, electrical action is not required to be applied to the memory cell 1231. In circuit operation, for example, the memory cell 1231 is selected by the decoders 1223 and 1224 and the selector 1225 in the same way as the case of writing data "1", though an output potential from the circuit 1226 to the bit line B3 is set to be approximately equal to Vcom or the bit line B3 is brought into a floating state. As a result, a low potential (for example, −5 V to 5 V) or no voltage (potential) is applied to the memory element 1215b; therefore, electric characteristics do not change and writing of data "0" is realized.

Subsequently, operation of writing data by optical action will be described. In this case, an insulating layer is irradiated with laser light from a conductive layer side which has a light transmitting property by a laser irradiation device. The laser irradiation device may be the same as the device used for the passive matrix memory device described with reference to FIGS. 8A to 8C.

In the case of using an organic compound material for an insulating layer, the insulating layer is oxidized or carbonized to be insulated by laser irradiation. Then, the resistance value of a memory element that is irradiated with laser light increases, whereas the resistance value of a memory element that is not irradiated with laser light does not change. When a conjugate polymer doped with photoacid generator is used as an insulating layer and irradiated with laser light, the insulating layer has conductivity. Therefore, a memory element that is irradiated with laser light has conductivity, whereas a memory element that is not irradiated with laser light has no conductivity.

Next, an operation in reading data by an electrical action will be described. Here, the circuit 1226 has a structure including a resistance element 1246 and a differential amplifier 1247. However, the structure of the circuit 1226 is not limited to the above structure, and any structure may be employed.

Subsequently, operation of reading data by electrical action in an active matrix memory device will be described. Reading data is performed by utilizing electric characteristics of the memory element 1215b, which are different between a memory cell with data "0" and a memory cell with data "1". For example, a method for reading data by utilizing the difference in electric resistance will be described under conditions where the electric resistance of a memory element constituting a memory cell having data "0" is R0 at a reading voltage, and the electric resistance of a memory element constituting a memory cell having data "1" is R1 at a reading voltage. Note that R1<<R0 is satisfied. For a structure of a readout portion of a reading/writing circuit, for example, the circuit 1226 using the resistance element 1246 and the differential amplifier 1247 shown in FIG. 19B can be used. The resistance element has a resistance value Rr, wherein R1<Rr<R0 is satisfied. It is also possible to use a transistor 1249 in the place of the resistance element 1246, and a clocked inverter 1248 in the place of the differential amplifier (FIG. 19C). Needless to say, a circuit structure is not limited to that of FIGS. 19A to 19C.

In the case of reading data from the memory cell 1231 in the x-th row and the y-th column, the memory cell 1231 is selected first by the decoders 1223 and 1224 and the selector 1225. Specifically, a predetermined voltage V24 is applied to a word line Wy connected to the memory cell 1231 by the decoder 1224 to turn on a transistor 1210a. In addition, a bit line Bx connected to the memory cell 1231 is connected to a terminal P of the circuit 1226 by the decoder 1223 and the selector 1225. As a result, the potential Vp of the terminal P is a value determined by resistance division of Vcom and V0 by the resistance element 1246 (resistance value: Rr) and the memory element 1215b (resistance value: R0 or R1). Therefore, Vp0=Vcom+(V0−Vcom)×R0/(R0+Rr) is satisfied in the case where the memory cell 1231 has data "0". Meanwhile, Vp1=Vcom+(V0−Vcom)×R1/(R1+Rr) is satisfied in the case where the memory cell 1231 has data "1". As a result, by selecting Vref to be between Vp0 and Vp1 in FIG. 19B, and by selecting a point of variation of a clocked inverter to be between Vp0 and Vp1 in FIG. 19C, reading can be carried out by outputting Lo/Hi (or Hi/Lo) as an output potential Vout, depending on data "0"/"1."

For example, it is assumed that the differential amplifier is operated at Vdd=3V, and Vcom is set to be 0 V, V0, 3 V, and Vref=1.5V. On the condition that R0/Rr=Rr/R1=9 is satisfied and on-resistance of the transistor 1210a can be ignored, Hi is outputted as Vout at Vp0=2.7 V when a memory cell has data "0", or Lo is outputted as Vout at Vp1=0.3 V when a memory cell has data "1". In this manner, reading from the memory cells can be performed.

In accordance with the above method, reading is performed from a voltage value utilizing the difference in a resistance value of the memory element 1215b and resistance division. Of course, the reading method is not limited thereto. For example, reading may be carried out by utilizing the difference in current value instead of utilizing the different in electric resistance. Further, when electrical characteristics of a memory cell have a diode property in which threshold voltage is different between data "0" and data "1", reading may be carried out by utilizing the difference in threshold voltage.

A memory element having the above structure and a memory device that is equipped with the memory element are nonvolatile memories; therefore, a battery for retaining data need not be built in, and a compact size, thin, and light weight memory device and semiconductor device can be provided. Further, by using the insulating material that is used in the above embodiment modes as an insulating layer, rewriting data cannot be performed though writing data (additionally) is possible. Consequently, forgery can be prevented and a memory device and a semiconductor device with ensured security can be provided.

It is to be noted that this embodiment mode can be performed by freely combining the structure of the memory element, the memory device and the semiconductor device including the memory element, which are shown in the above embodiment modes.

The invention claimed is:
1. A method for manufacturing a semiconductor device having a memory element, comprising:
   forming a first conductive layer;
   adding a metal element or a semiconductor element to the first conductive layer;

forming an insulator mixture region in the first conductive layer by oxidizing the metal element or the semiconductor element;
forming an organic compound layer in contact with the insulator mixture region; and
forming a second conductive layer in contact with the organic compound layer.

2. The method for manufacturing a semiconductor device according to claim 1, wherein the second conductive layer contains a second insulator.

3. The method for manufacturing a semiconductor device having a memory element according to claim 1,
wherein the insulator mixture region of the first conductive layer contains a plurality of insulators, and
wherein the plurality of insulators are distributed in the insulator mixture region of the first conductive layer.

4. The method for manufacturing a semiconductor device having a memory element according to claim 1,
wherein the insulator mixture region in the first conductive layer contains a plurality of insulators, and
wherein a concentration of the plurality of insulators in a first region of the insulator mixture region is different from a concentration of the plurality of insulators in a second region of the insulator mixture region.

5. The method for manufacturing a semiconductor device having a memory element according to claim 1, further comprising the step of forming a transistor,
wherein the first conductive layer is electrically connected to the transistor.

6. The method for manufacturing a semiconductor device having a memory element according to claim 1, wherein the first conductive layer comprises metal.

7. A method for manufacturing a semiconductor device, comprising:
forming a transistor;
forming an insulating film over the transistor; and
forming a memory element, the step of formation of the memory element comprising:
forming a first conductive layer over and in contact with the insulating film;
forming an insulator mixture region in the first conductive layer by modifying a part of a surface of the first conductive layer;
forming an organic compound layer in contact with the first conductive layer; and
forming a second conductive layer in contact with the organic compound layer,
wherein the insulator mixture region contains a plurality of insulators, and
wherein a concentration of the plurality of insulators in a first region of the insulator mixture region is different from a concentration of the plurality of insulators in a second region of the insulator mixture region.

8. The method for manufacturing a semiconductor device according to claim 7, wherein the second conductive layer contains a second insulator.

9. The method for manufacturing a semiconductor device having a memory element according to claim 7, wherein the first conductive layer comprises metal.

10. A method for manufacturing a semiconductor device, comprising:
forming a memory element, formation of the memory element comprising:
forming a first conductive layer over and in contact with an insulating film;
forming an insulator mixture region in the first conductive layer by co-evaporation method or sputtering method;
forming an organic compound layer in contact with the insulator mixture region; and
forming a second conductive layer in contact with the organic compound layer,
wherein the insulator mixture region contains a plurality of insulators, and
wherein a concentration of the plurality of insulators in a first region of the insulator mixture region is different from a concentration of the plurality of insulators in a second region of the insulator mixture region.

11. The method for manufacturing a semiconductor device according to claim 10, wherein the second conductive layer contains a second insulator.

12. The method for manufacturing a semiconductor device having a memory element according to claim 10, further comprising the step of forming a transistor,
wherein the first conductive layer is electrically connected to the transistor.

13. The method for manufacturing a semiconductor device having a memory element according to claim 10, wherein the first conductive layer comprises metal.

14. A method for manufacturing a semiconductor device, comprising:
forming a memory element, formation of the memory element comprising:
forming a first conductive layer over and in contact with an insulating film;
forming an insulator mixture region in the first conductive layer by modifying a part of a surface of the first conductive layer;
forming an organic compound layer in contact with the insulator mixture region; and
forming a second conductive layer in contact with the organic compound layer,
wherein the insulator mixture region contains a plurality of insulators, and
wherein a concentration of the plurality of insulators in a first region of the insulator mixture region is different from a concentration of the plurality of insulators in a second region of the insulator mixture region.

15. The method for manufacturing a semiconductor device according to claim 14, wherein the second conductive layer contains a second insulator on the organic compound layer.

16. The method for manufacturing a semiconductor device having a memory element according to claim 14, further comprising the step of forming a transistor,
wherein the first conductive layer is electrically connected to the transistor.

17. The method for manufacturing a semiconductor device having a memory element according to claim 14, wherein the first conductive layer comprises metal.

* * * * *